(12) United States Patent
Katti

(10) Patent No.: US 10,876,839 B2
(45) Date of Patent: *Dec. 29, 2020

(54) SPINTRONIC GYROSCOPIC SENSOR DEVICE

(71) Applicant: Honeywell International Inc., Morris Plains, NJ (US)

(72) Inventor: Romney R. Katti, Shorewood, MN (US)

(73) Assignee: Honeywell International Inc., Charlotte, NC (US)

( * ) Notice: Subject to any disclaimer, the term of this patent is extended or adjusted under 35 U.S.C. 154(b) by 185 days.

This patent is subject to a terminal disclaimer.

(21) Appl. No.: 16/195,515

(22) Filed: Nov. 19, 2018

(65) Prior Publication Data

US 2020/0080844 A1   Mar. 12, 2020

Related U.S. Application Data

(60) Provisional application No. 62/729,881, filed on Sep. 11, 2018.

(51) Int. Cl.
| | |
|---|---|
| *G01C 19/5776* | (2012.01) |
| *H01F 10/32* | (2006.01) |
| *H01L 27/22* | (2006.01) |
| *H01L 43/02* | (2006.01) |

(52) U.S. Cl.
CPC ..... *G01C 19/5776* (2013.01); *H01F 10/3254* (2013.01); *H01L 27/22* (2013.01); *H01L 43/02* (2013.01)

(58) Field of Classification Search
CPC . G01C 19/5776; H01F 10/3254; H01L 27/22; H01L 43/02; G11B 5/3909
See application file for complete search history.

(56) References Cited

U.S. PATENT DOCUMENTS

| | | | |
|---|---|---|---|
| 5,764,567 A * | 6/1998 | Parkin | H01F 10/3254 |
| | | | 365/173 |
| 5,859,368 A | 1/1999 | Cargille et al. | |
| 5,905,202 A | 5/1999 | Kubena et al. | |
| 5,962,782 A | 10/1999 | O'Keefe et al. | |

(Continued)

FOREIGN PATENT DOCUMENTS

| | | |
|---|---|---|
| CN | 102853826 A | 1/2013 |
| CN | 105180914 | 12/2015 |

(Continued)

OTHER PUBLICATIONS

Extended Search Report from counterpart European Application No. 19195761.2, dated Jan. 28, 2020, 7 pp.

(Continued)

*Primary Examiner* — Francis C Gray
(74) *Attorney, Agent, or Firm* — Shumaker & Sieffert, P.A.

(57) ABSTRACT

A magnetic tunnel junction (MTJ) based sensor device includes a MTJ element and processing circuitry. The MTJ element includes a free layer, a pinned layer, and a tunnel barrier, the tunnel barrier being arranged above the pinned layer, wherein the free layer is adapted to flex away from the tunnel barrier during gyroscopic motion. The processing circuitry is configured to measure a resistance at the MTJ element and determine gyroscopic motion based on the resistance at the MTJ element.

20 Claims, 25 Drawing Sheets

(56) References Cited

U.S. PATENT DOCUMENTS

| | | | |
|---|---|---|---|
| 6,052,263 A | 4/2000 | Gill | |
| 6,131,457 A | 10/2000 | Sato | |
| 6,507,187 B1 | 1/2003 | Olivas et al. | |
| 7,145,330 B2 | 12/2006 | Xiao | |
| 7,239,543 B2 | 7/2007 | Chung et al. | |
| 7,547,480 B2* | 6/2009 | Chung | G01L 19/16 338/14 |
| 7,635,974 B2 | 12/2009 | Guo et al. | |
| 7,656,622 B2 | 2/2010 | Tera et al. | |
| 7,690,263 B2 | 4/2010 | Jen et al. | |
| 7,732,881 B2 | 6/2010 | Wang | |
| 7,738,286 B2 | 6/2010 | Ito et al. | |
| 8,068,316 B2 | 11/2011 | Dieny et al. | |
| 8,104,345 B2 | 1/2012 | Bruckl et al. | |
| 8,120,127 B2 | 2/2012 | Nagahara et al. | |
| 8,698,260 B2* | 4/2014 | Jan | H01L 43/08 257/421 |
| 8,830,737 B2* | 9/2014 | Keshtbod | G11C 11/16 365/158 |
| 8,836,056 B2* | 9/2014 | Oguz | H01L 43/08 257/421 |
| 9,250,070 B2 | 2/2016 | Wootten | |
| 9,254,992 B2 | 2/2016 | Ju | |
| 9,489,998 B1* | 11/2016 | Schafer | G11C 11/161 |
| 10,008,248 B2 | 6/2018 | Buhrman et al. | |
| 2008/0247096 A1* | 10/2008 | Lee | G11C 11/1693 360/324.2 |
| 2016/0153780 A1 | 6/2016 | Zhang et al. | |
| 2017/0092846 A1 | 3/2017 | Doyle et al. | |
| 2017/0160308 A1 | 6/2017 | Alaoui | |
| 2017/0249550 A1 | 8/2017 | Sengupta et al. | |
| 2018/0190899 A1 | 7/2018 | Kim et al. | |

FOREIGN PATENT DOCUMENTS

| | | |
|---|---|---|
| CN | 206132803 U | 4/2017 |
| CN | 106645797 A | 5/2017 |
| CN | 104567848 B | 9/2017 |
| CN | 107255737 A | 10/2017 |
| CN | 107421525 A | 12/2017 |
| WO | 2018125142 A | 7/2018 |

OTHER PUBLICATIONS

Lirkov et al., "Large-Scale Scientific Computing," 10th International Conference, LSSC 2015, Jun. 8, 2015, 442 pp.

Elwell, et al., "The development of magnetic tunnel junction fabrication techniques," Jul. 31, 2002, 230 pp.

Response to Extended Search Report dated Jan. 28, 2020, from counterpart European Application No. 19195761.2, filed May 21, 2020, 18 pp.

Communication pursuant to Article 94(3) EPC from counterpart European Application No. 19195761.2, dated Oct. 30, 2020, 7 pp.

* cited by examiner

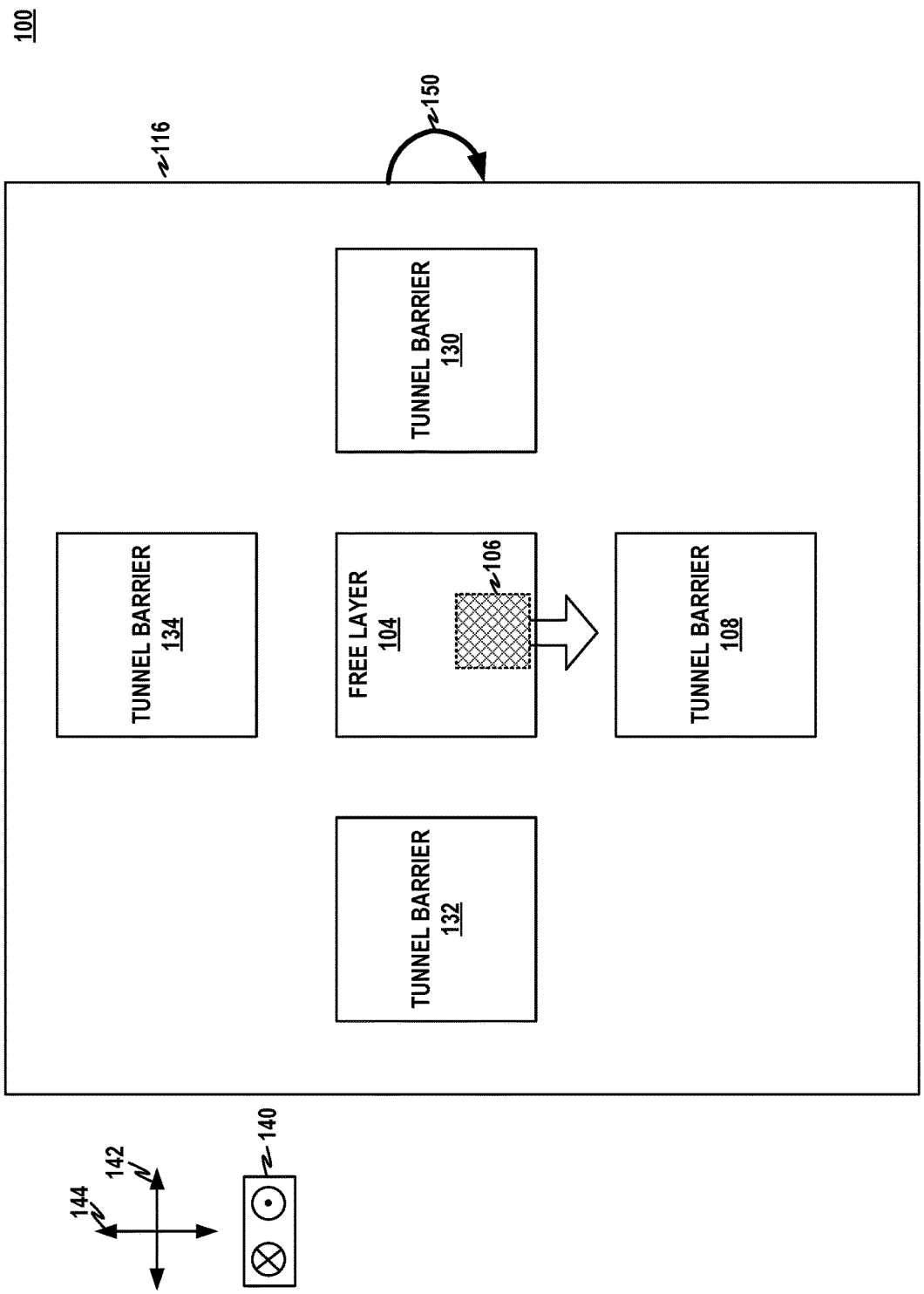

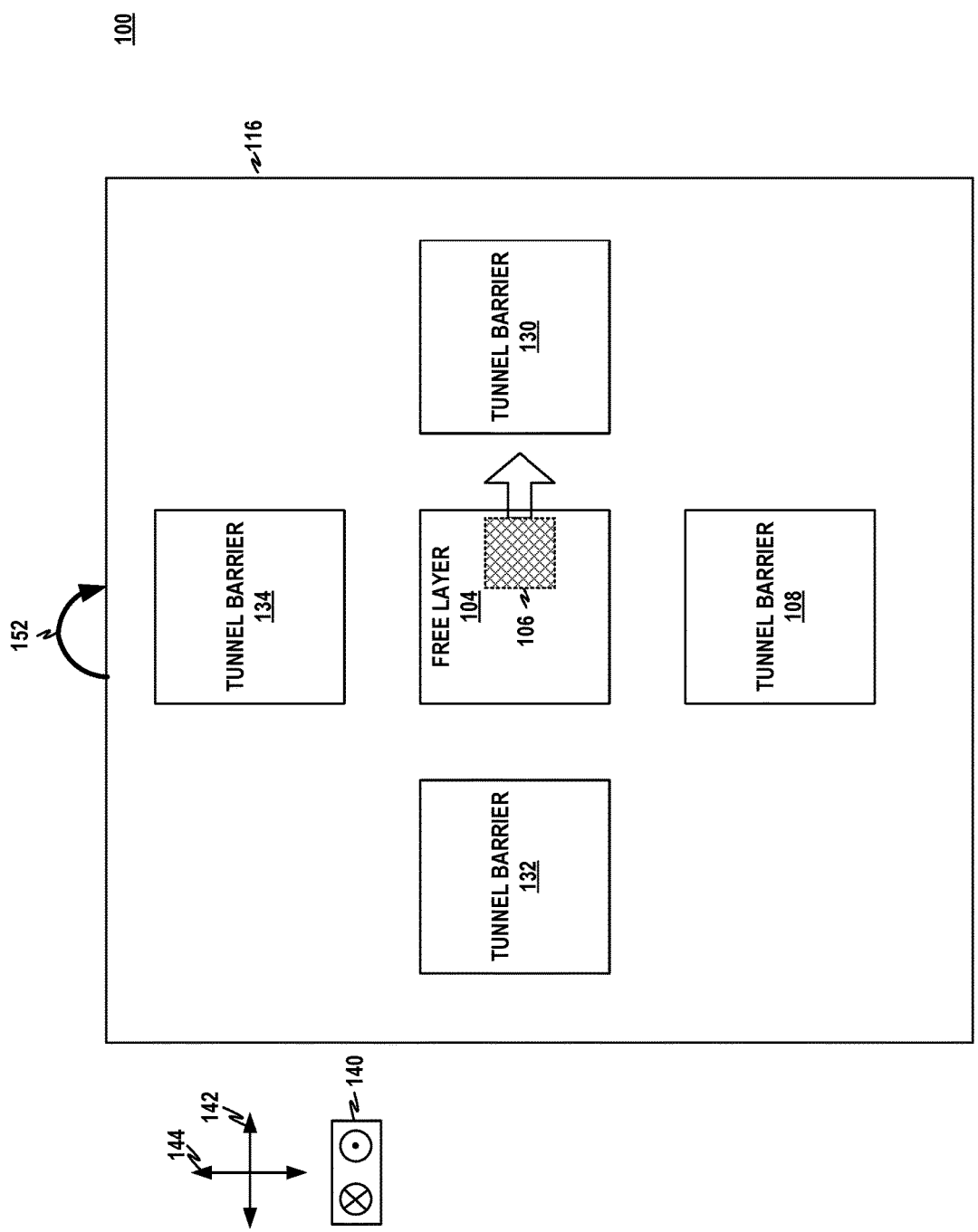

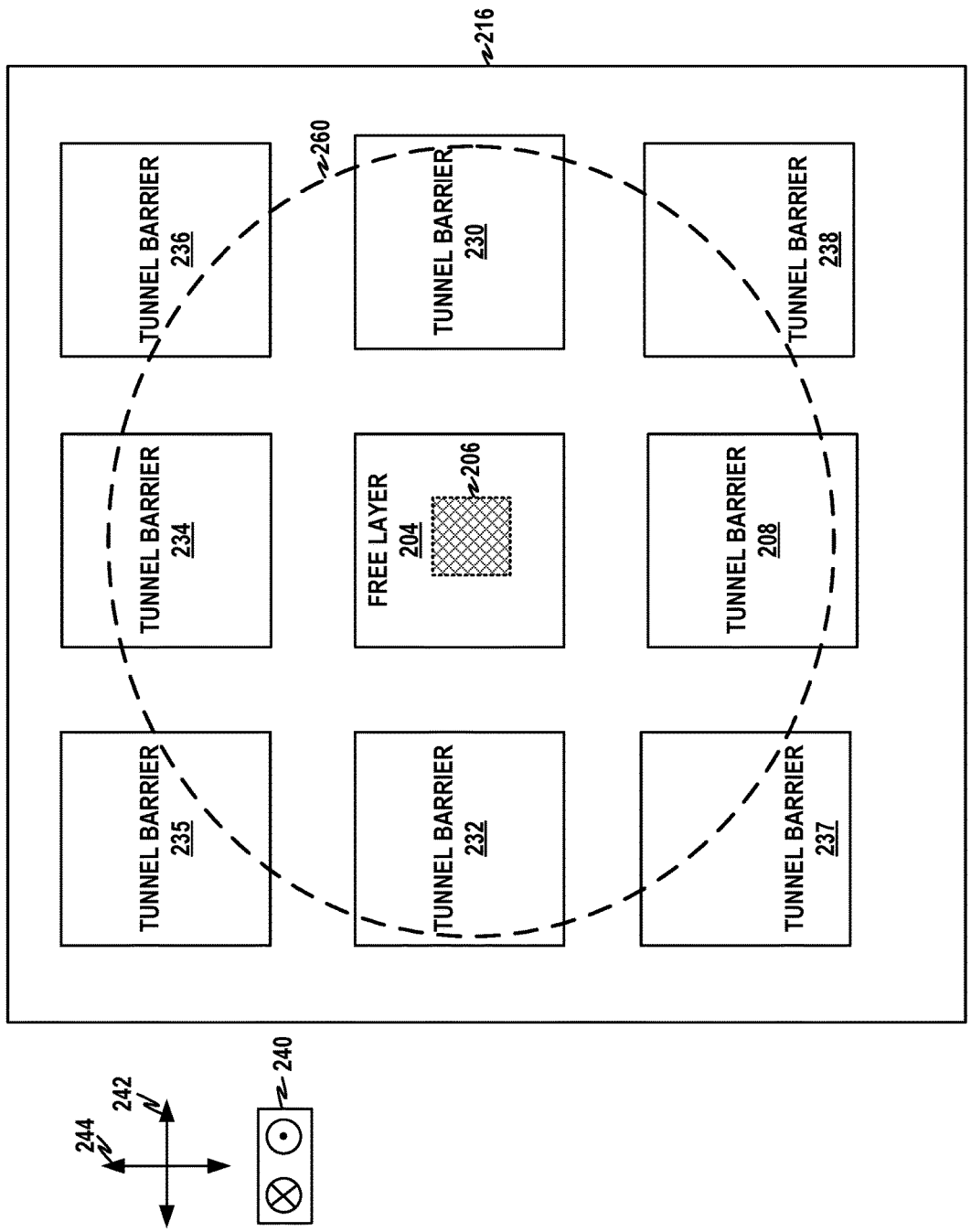

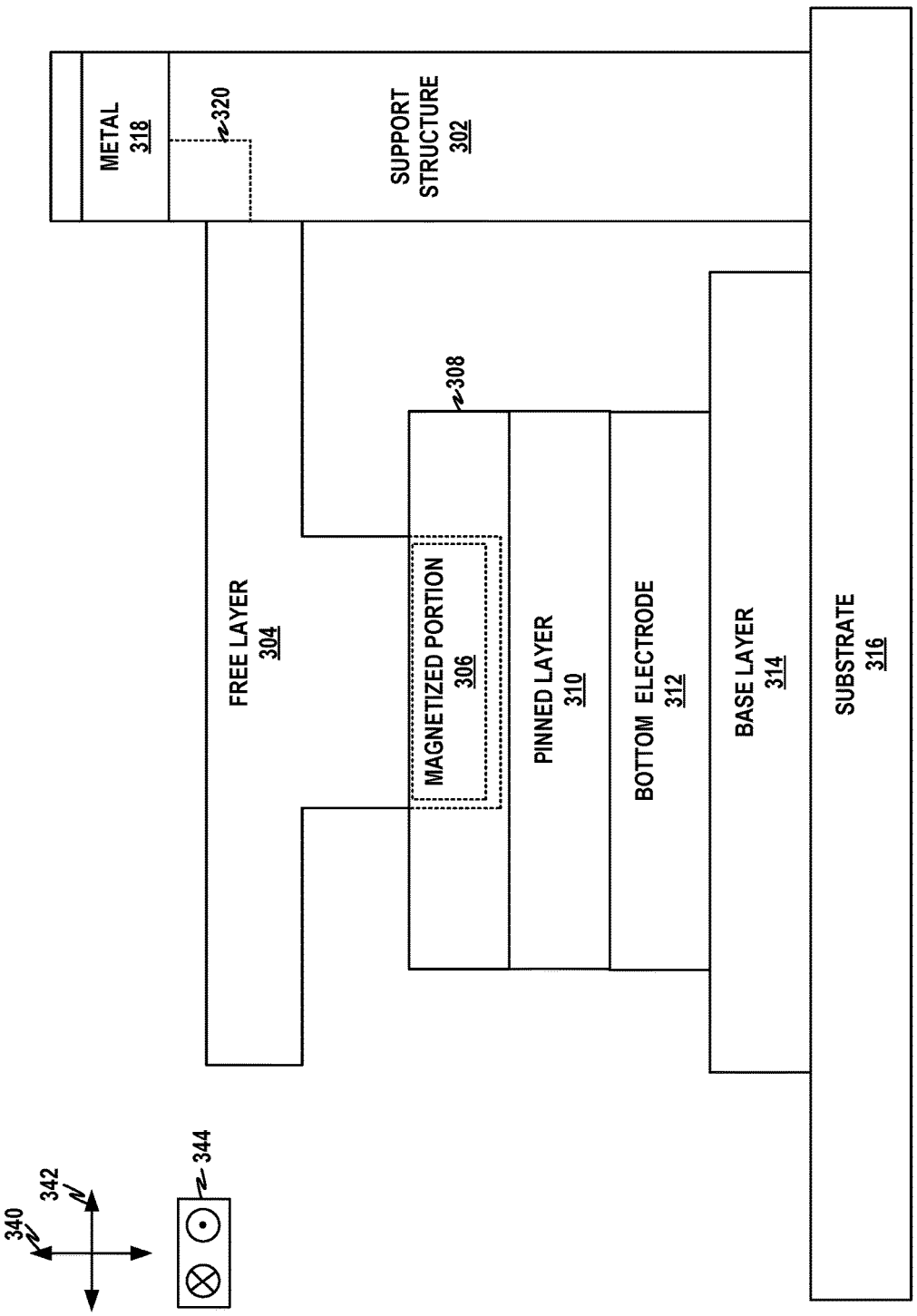

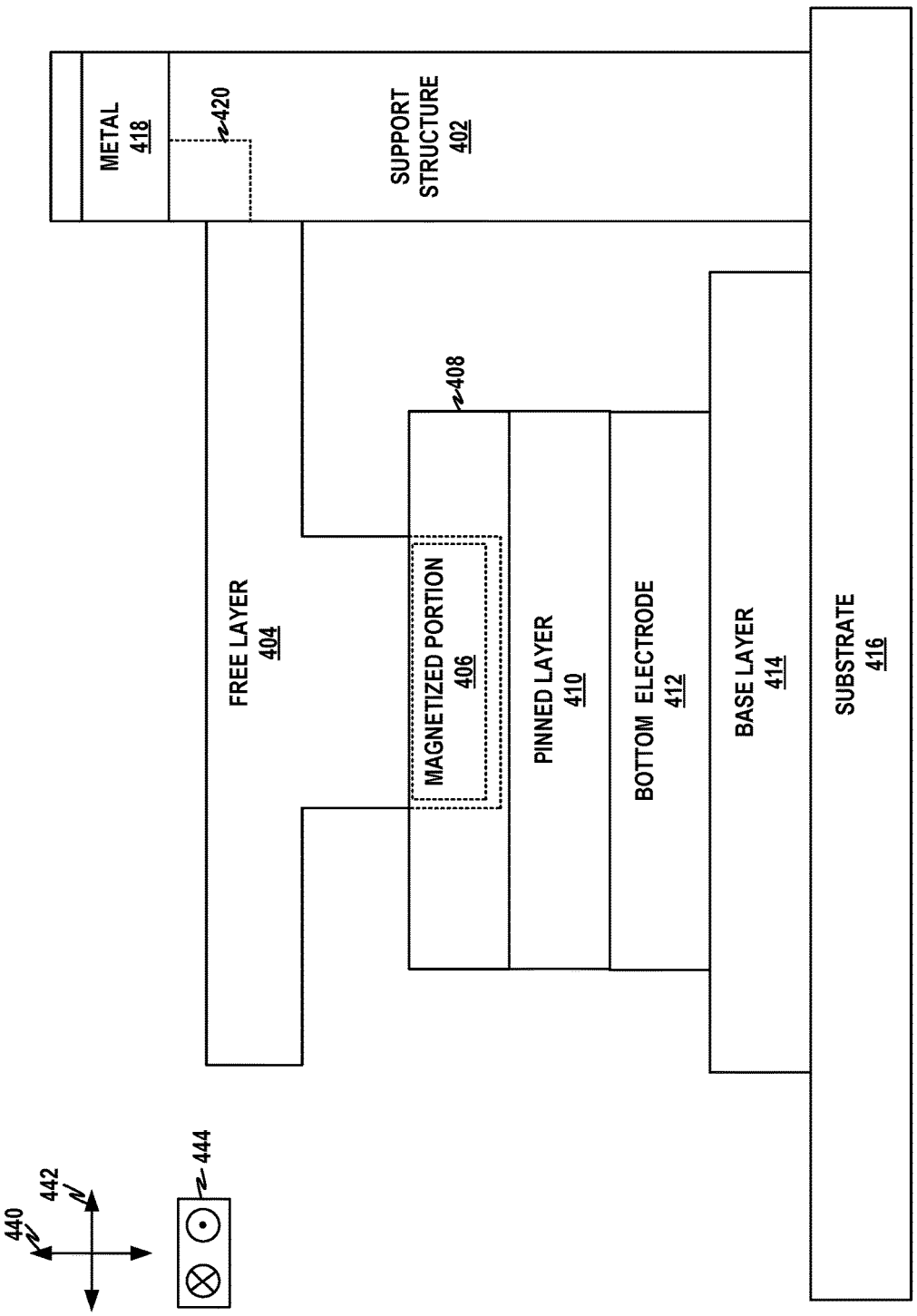

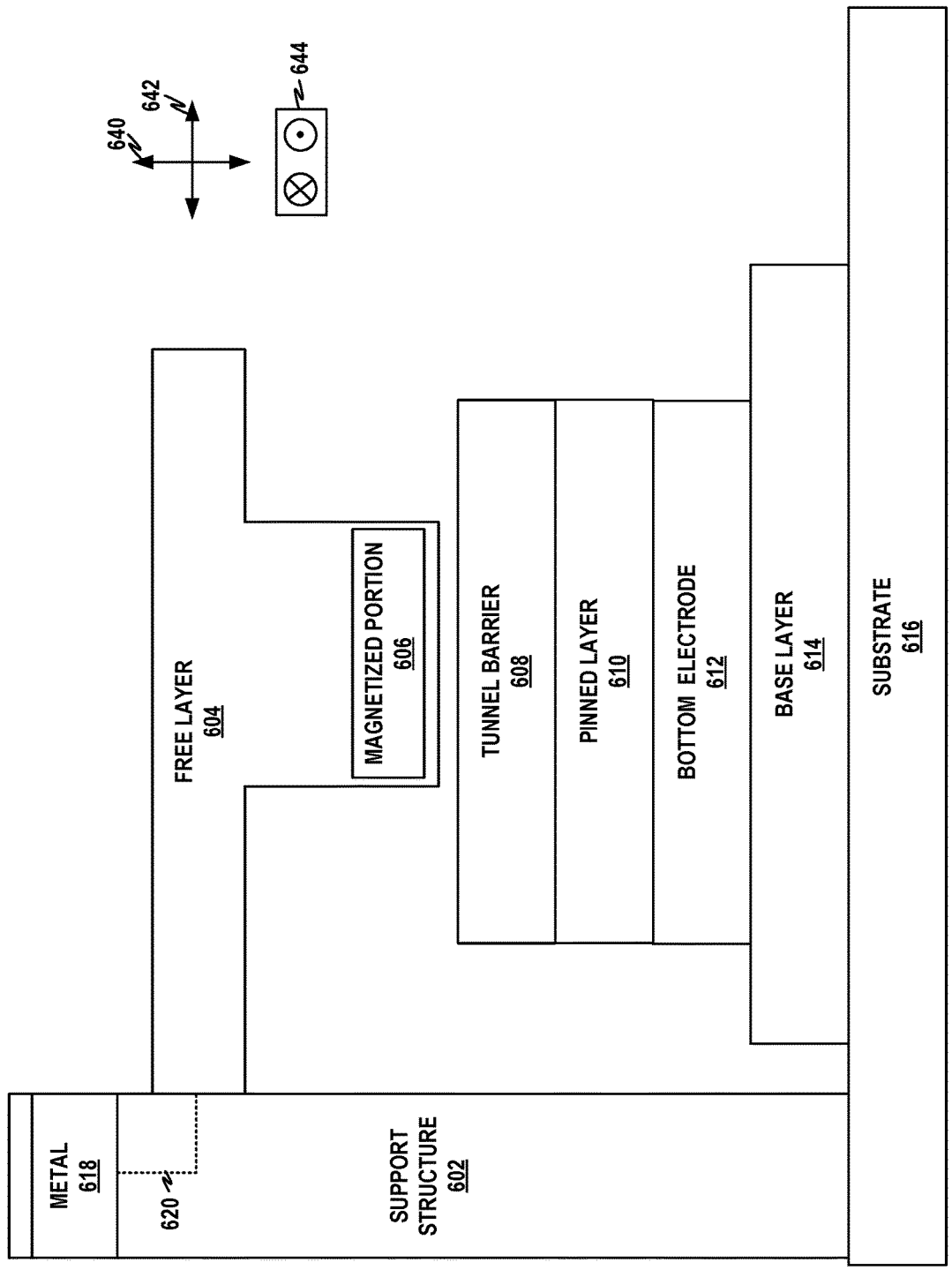

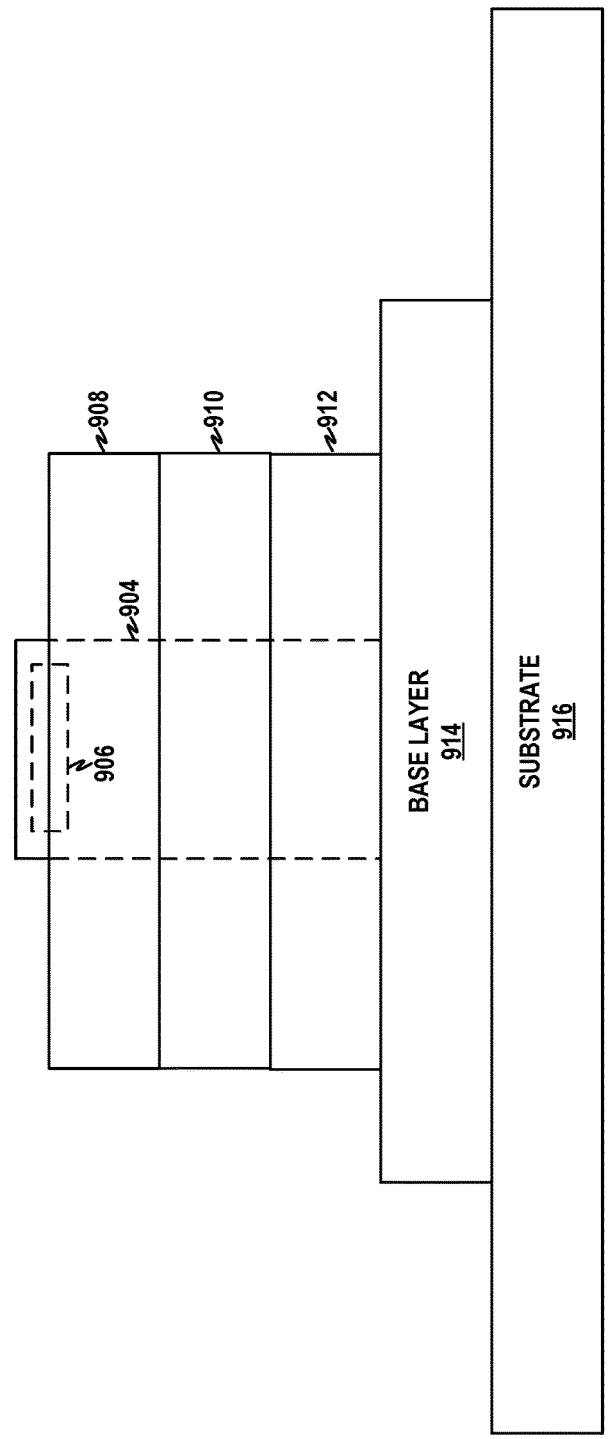

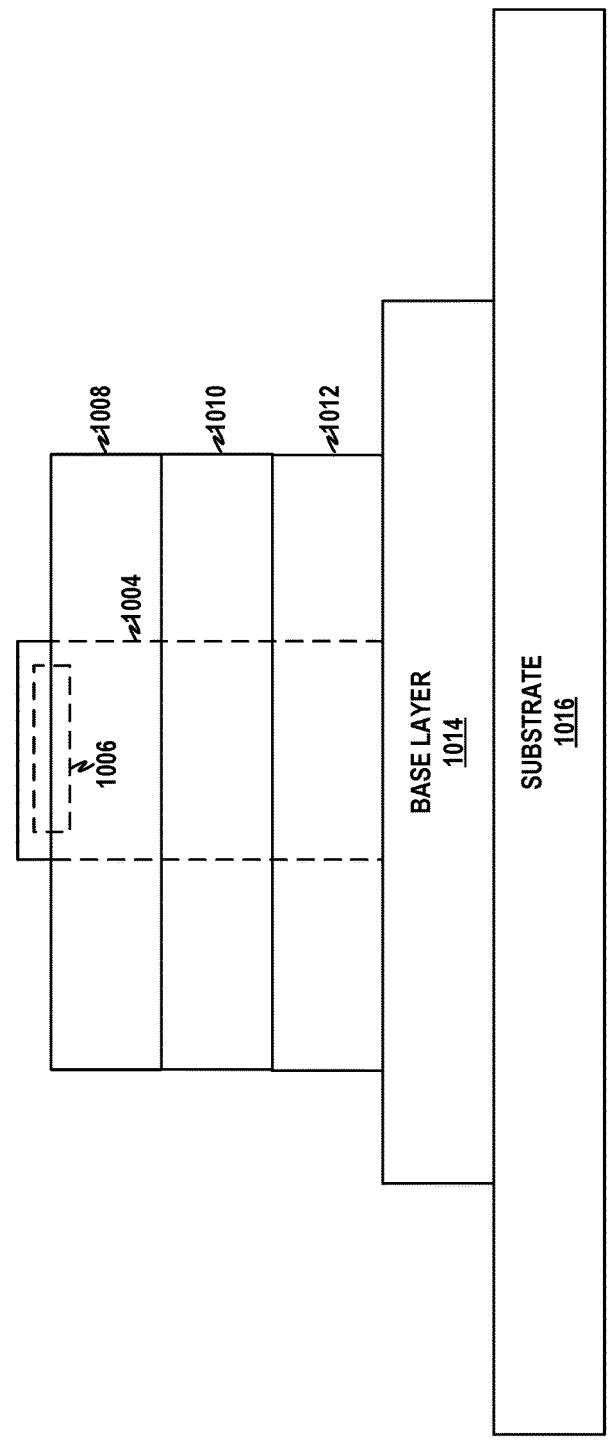

SPINTRONIC GYROSCOPIC SENSOR DEVICE

PRIORITY CLAIM

This application claims the benefit of U.S. Provisional Patent Application No. 62/729,881, filed Sep. 11, 2018, the entire content of which is incorporated herein by reference.

TECHNICAL FIELD

This disclosure relates to sensor devices and, more specifically, to spintronic-based devices that are configured to detect gyroscopic motion.

BACKGROUND

Some devices include a gyroscopic sensor device that monitors gyroscopic motion of a device. It is desirable for such devices to detect gyroscopic motion of the device to provide context of the device. For example, a position of the device may be controlled based on the gyroscopic motion of the device. It is generally desirable for a gyroscopic sensor device to measure accurately gyroscopic motion and to operate in a smaller space. Current types of gyroscopic sensor devices include non-magnetic sensors that generate a voltage in response changes in angular velocity of the device.

SUMMARY

This disclosure generally describes techniques for detecting gyroscopic motion using a spintronic-based sensor device. The techniques may in some instances provide for a higher density for a smaller and more lightweight form factor. Furthermore, a spintronic-based sensor device may be more resistive to ElectroMagnetic Interference (EMI) than non-magnetic sensors, which may be of particular benefit to certain applications.

In one example, a magnetic tunnel junction (MTJ) based sensor device includes a MTJ element and processing circuitry. The MTJ element includes a free layer, a pinned layer, and a tunnel barrier, the tunnel barrier being arranged above the pinned layer, wherein the free layer is adapted to flex away from the tunnel barrier during gyroscopic motion. The processing circuitry is configured to measure a resistance at the MTJ element and determine gyroscopic motion based on the resistance at the MTJ element.

In another example, a method for detecting gyroscopic motion using a MTJ based sensor device includes measuring, by processing circuitry, a resistance at a MTJ element, wherein the MTJ element comprises a free layer, a pinned layer, and a tunnel barrier, the tunnel barrier being arranged above the pinned layer and wherein the free layer is adapted to flex away from the tunnel barrier during gyroscopic motion, determining, by the processing circuitry, gyroscopic motion based on the resistance at the MTJ element, and outputting, by the processing circuitry, an indication of the gyroscopic motion.

In another example, a MTJ based sensor device includes means for measuring a resistance at a MTJ element, wherein the MTJ element comprises a free layer, a pinned layer, and a tunnel barrier, the tunnel barrier being arranged above the pinned layer and wherein the free layer is adapted to flex away from the tunnel barrier during gyroscopic motion, means for determining gyroscopic motion based on the resistance at the MTJ element, and means for outputting an indication of the gyroscopic motion.

The details of one or more aspects of the disclosure are set forth in the accompanying drawings and the description below. Other features, objects, and advantages of the devices, systems, methods, and techniques described in this disclosure will be apparent from the description and drawings, and from the claims.

BRIEF DESCRIPTION OF DRAWINGS

FIG. 1C shows a conceptual illustration of a cross-sectional view of the first MTJ element of FIG. 1A during a first angular velocity.

FIG. 1D shows a conceptual illustration of a cross-sectional view of the first MTJ element of FIG. 1A during a second angular velocity.

FIG. 2B shows a conceptual illustration of a top-view of the second MTJ element of FIG. 2A.

FIG. 3A shows a conceptual illustration of a cross-sectional view of a third MTJ element configured to detect gyroscopic motion.

FIG. 4A shows a conceptual illustration of a cross-sectional view of a fourth MTJ element configured to detect gyroscopic motion.

FIG. 6A shows a conceptual illustration of a cross-sectional view of a sixth MTJ element configured to detect gyroscopic motion.

FIG. 9A shows a conceptual illustration of a cross-sectional view of a ninth MTJ element configured to detect gyroscopic motion.

FIG. 10A shows a conceptual illustration of a cross-sectional view of a tenth MTJ element configured to detect gyroscopic motion.

DETAILED DESCRIPTION

Figure 1A:
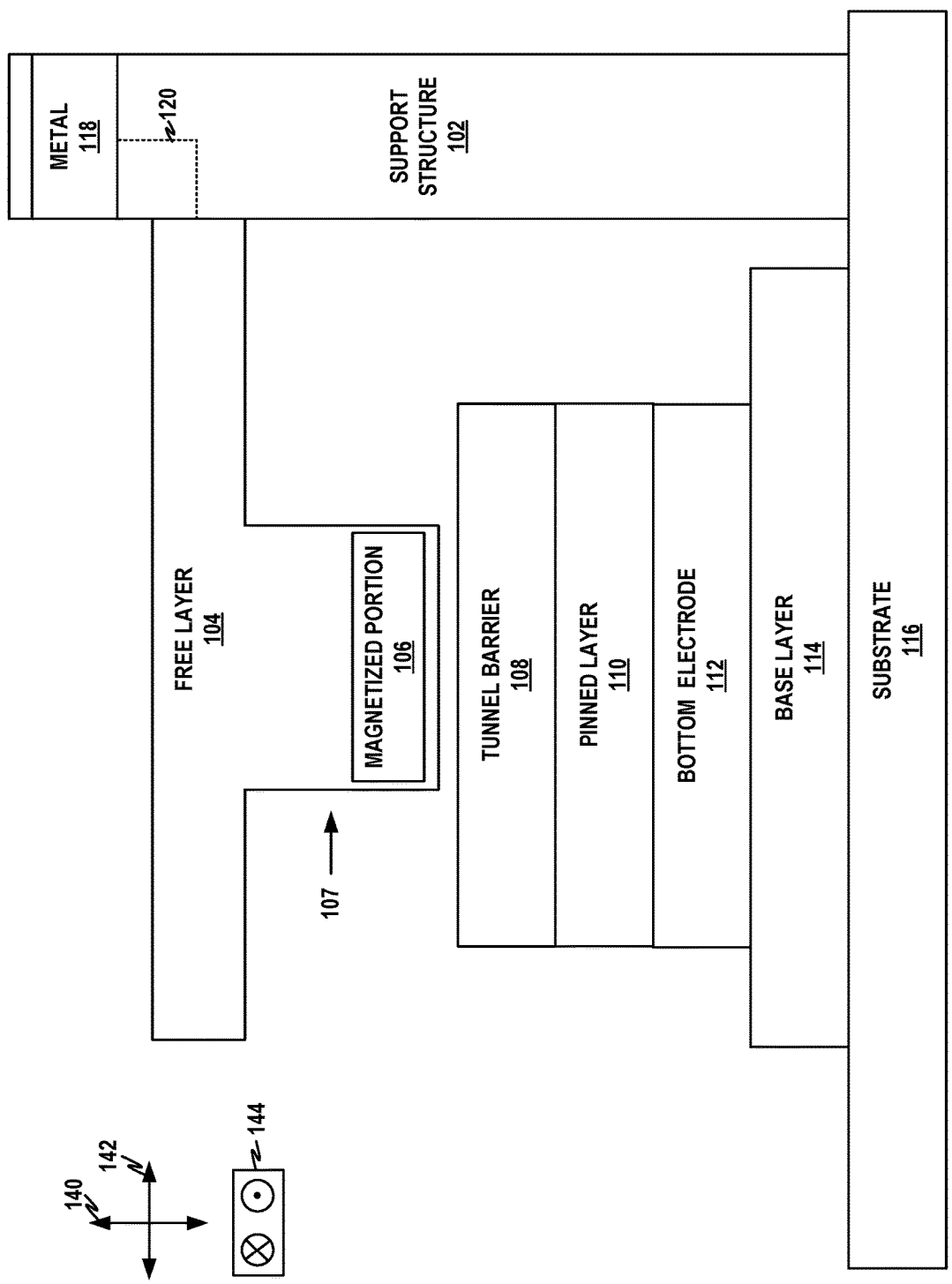
FIG. 1A shows a conceptual illustration of a cross-sectional view of a first magnetic tunnel junction (MTJ) element configured to gyroscopic motion.

Some applications have been identified in which miniaturized sensing devices are needed for operation in unique environments. Such sensing devices may be configurable for strategic applications. For example, such sensing devices may be radiation-hardened, and to include magnetically-based devices that can be integrated (e.g., monolithically, in particular initially) into a compact module with Application-Specific Integrated Circuits (ASICs) including those that contain embedded Magnetoresistive Random Access Memory (MRAM) bits. Of various sensing devices of interest, one device of interest that is discussed here is a gyroscope sensor device that could be used with or separately from other sensors (e.g., an acceleration sensor, a mechanical shock and vibration sensor, etc.), and that may support compatibility with MRAM technology.

In accordance with one or more techniques described herein, circuitry may be constructed to include a magnetic tunnel junction (MTJ), which is an example of a spintronic device, with desired, resistance, resistance-area product, and dimensions. Examples of resistance and/or magnetoresistance may include, but are not limited to, tunnel magnetoresistance (TMR), giant magnetoresistance (GMR), anisotropic magnetoresistive (AMR), and other resistance and/or magnetoresistance effects.

Within a tunnel barrier structure between two magnetic layers of the MTJ, techniques described herein may include one or more test structure(s) such as rectangular, square, circular, ovoid, or quasi-circular shape(s) with designed symmetries and/or asymmetries and placed in a circular or similar arrangement, that can be tethered/suspended to respond to pivoting and/or torsional displacements and rotations. The test structure(s) can be constructed from and/or coated with a magnetic material that may be patterned. Processing circuitry may make use electrical, electronic, or spintronic current(s). Tunneling current(s) can be spin-dependent or spin-independent, and ballistic electron tunneling may be used. Anisotropic, Giant, and/or Tunneling Magneto-Resistive effects may be used for sensing gyroscope motion.

For example, a free layer may flex towards and/or away from each one of a plurality of pinned layers. Such flexing by the free layer may cause corresponding changes in resistance of the MTJ formed by the free layer and each one of the plurality of pinned layers. In this way, processing circuitry may detect gyroscopic motion using the resistance of the MTJ.

Such magnetic/spintronic devices may provide unique and desired application functionality, customization prospects, and environmental capability (e.g., shock, vibration, radiation, acceleration, motion) for various environments. Such magnetic/spintronic devices may offer materials and technological similarity and compatibility with MRAM bits and other sensing devices such as accelerometers, gyros, and pressure sensors, which may support integration, modularity, miniaturization, and packaging with embedded MRAM and ASICS. In some examples, the spintronic-based gyroscopic sensor device described herein may be used for die-to-die or monolithic integration with MTJs/MTJ die.

FIG. 1A shows a conceptual illustration of a cross-sectional view of a first magnetic tunnel junction (MTJ) element 100 configured to gyroscopic motion. MTJ element 100 may include support structure 102, free layer 104, tunnel barrier 108, pinned layer 110, bottom electrode 112, base layer 114, and substrate 116. As shown in FIG. 1A, support structure 102 extends from substrate 116 along vertical direction 140 and is spaced apart from tunnel barrier 108 along first horizontal direction 142. Second horizontal direction 144 is perpendicular to first horizontal direction 142 and vertical direction 140.

Base layer 114 may comprise, for example, silicon (Si). Substrate 116 may comprise, for example, silicon (Si). In some examples, substrate 116 may include processing circuitry. For example, substrate 116 may include metallization and/or integrated circuitry (e.g., Complementary metal-oxide-semiconductor (CMOS)).

Support structure 102 may be adapted to arrange free layer 104 above tunnel barrier 108. Support structure 102 may be formed of silicon, silicon nitride, silicon oxide, copper, aluminum, aluminum oxide, magnesium oxide, or another material. As shown, support structure 102 may include via 120 and metal 118. Via 120 and metal 118 may be formed of a conductive material to permit a connection to MTJ element 100. Examples of conductive materials may include, but are not limited to, copper. Bottom electrode 112 may be formed of a conductive material to permit a connection to MTJ element 100. In the example of FIG. 1A, support structure 102 is arranged right of tunnel barrier 508 along first horizontal direction 142. In some examples, support structure 102 is arranged left of tunnel barrier 508 along first horizontal direction 142. Support structure 102 may be arranged above and/or below tunnel barrier 108 along second horizontal direction 144.

Free layer 104 may include a magnetization direction that is free to switch between a parallel orientation and an antiparallel orientation. As shown, free layer 104 may include magnetized portion 106. In the example of FIG. 1, magnetized portion 106 is arranged above tunnel barrier 108. Magnetized portion 106 may include, for example, but not limited to, a metal and/or a metal/ferromagnetic metal system. For instance, magnetized portion 106 may be formed of a metal or metal/ferromagnetic metal system on Silicon Oxide (SiOx), Silicon Nitride (SiNx), and/or Silicon (Si).

Tunnel barrier 108 includes a non-magnetic metal that separates free layer 104 and pinned layer 110. In some examples, tunnel barrier 108 may be formed of aluminum oxide, magnesium oxide, or another material. In the example of FIG. 1A, free layer 104 and/or magnetized portion 106 is spaced apart from tunnel barrier 108 along vertical direction 140. For instance, a void may separate free layer 104 and tunnel barrier 108. In some instances, a void may separate magnetized portion 106 and tunnel barrier 108. In some examples, a bottom portion of free layer 104 may be adjacent to a top portion of tunnel barrier 108 along vertical direction 140. In some examples, free layer 104 and/or magnetized portion 106 is spaced next to tunnel barrier 108 along vertical direction 140.

Pinned layer 110 may include a magnetization direction that is fixed or "pinned" to a single orientation. For example, pinned layer 110 may be pinned in a parallel orientation. In other examples, pinned layer 110 may be pinned in an antiparallel orientation. In the example of FIG. 1A, pinned layer 110 may include an anti-ferromagnetic layer, such that the magnetization direction of the pinned layer 110 is "pinned" in a particular orientation the magnetization direction of the pinned layer 110 remains relatively fixed when operational magnetic fields are applied to MTJ element 100.

In the example of FIG. 1A, MTJ element 100 may be formed as follows. Initially, material for tunnel barrier 108 and pinned layer 110 is deposited. An oxide is formed on tunnel barrier 108 and tunnel barrier 108 and pinned layer 110 are etched. Tunnel barrier 108 and pinned layer 110 are encapsulated (for spacing). Material for free layer 104 (which can be rectangular or triangular, e.g., in area) and support structure 102 are deposed (with a top electrode for connection to metallization). The encapsulating material is removed and/or dissolved.

In the example of FIG. 1A, a magnetization direction of free layer 104 is used to detect a gyroscopic motion of MTJ element 100. For example, portion 107 of free layer 104 may flex in response to gyroscopic motion, resulting in a corresponding change in resistance and/or magnetoresistance of MTJ element 100. In this example, processing circuitry may detect gyroscopic motion using the resistance and/or magnetoresistance of the MTJ element 100. In this manner, MTJ element 100 may be used as a gyroscopic motion sensor.

Figure 1B:
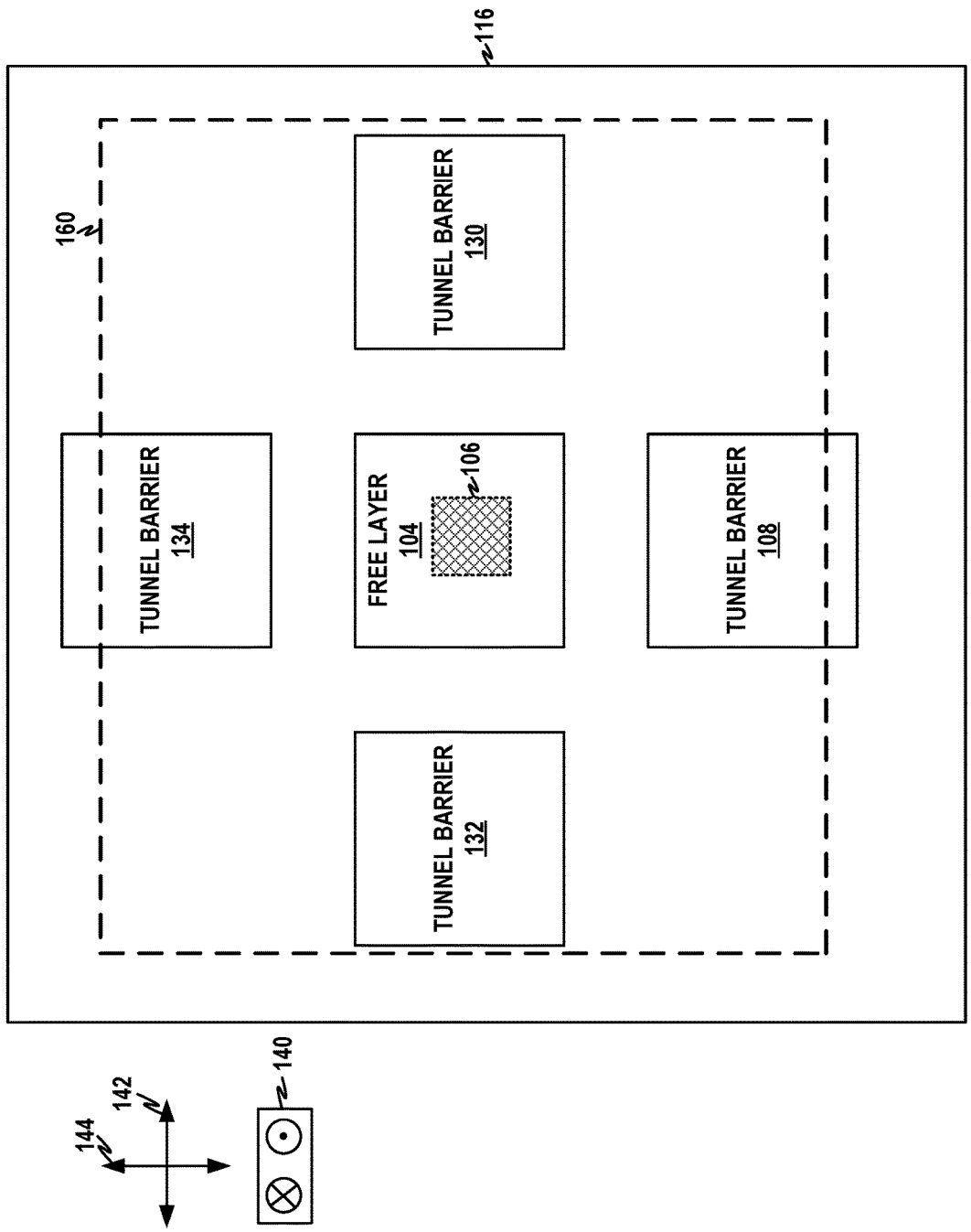
FIG. 1B shows a conceptual illustration of a top-view of the first MTJ element of FIG. 1A.

FIG. 1B shows a conceptual illustration of a top-view of the first MTJ element 100 of FIG. 1A. In the example of FIGS. 1A and 1B, first MTJ element 100 includes tunnel barriers 130, 132, and 134, each one of which may be substantially similar to tunnel barrier 108. Although not shown, each one of tunnel barriers 130, 132, and 134 may include a corresponding pinned layer and bottom electrode. For example, each tunnel barrier of tunnel barriers 108, 130, 132, and 134 may be arranged above a respective pinned layer. As shown, tunnel barriers 108, 130, 132, and 134 (and respective pinned layers) are arranged relative to free layer 104 to detect a square motion 160. In some examples, tunnel barriers 108, 130, 132, and 134 (and respective pinned layers) may be arranged relative to free layer 104 to detect a rectangular motion.

As shown, tunnel barrier 130 is arranged right of free layer 104 along first horizontal direction 142. In this example, tunnel barrier 132 is arranged left of free layer 104 along first horizontal direction 142. Said differently, for example, tunnel barrier 132 is arranged along first horizontal direction 142 on an opposite side of free layer 104 from tunnel barrier 130. In this example, tunnel barrier 108 is arranged below free layer 104 along second horizontal direction 144. In this example, tunnel barrier 134 is arranged above free layer 104 along second horizontal direction 144. Said differently, for example, tunnel barrier 108 is arranged along second horizontal direction 144 on an opposite side of free layer 104 from tunnel barrier 134.

As shown, magnetized portion 106 is centered to be approximately equidistant from tunnel barriers 108, 130, 132, and 134 along first horizontal direction 142 and second horizontal direction 144.

FIG. 1C shows a conceptual illustration of a cross-sectional view of the first MTJ element 100 of FIG. 1A during first angular velocity 150. In the example of FIG. 1C, portion 107 of free layer 104 flexes toward tunnel barrier 108 along second horizontal direction 144 in response to first angular velocity 150. As such, magnetized portion 106 is arranged closer to tunnel barrier 108 than tunnel barrier 134, which reduces a resistance and/or magnetoresistance between free layer 104 and a pinned layer below tunnel barrier 108.

FIG. 1D shows a conceptual illustration of a cross-sectional view of the first MTJ element 100 of FIG. 1A during a second angular velocity 152. In the example of FIG. 1D, portion 107 of free layer 104 flexes toward tunnel barrier 130 along first horizontal direction 142 in response to second angular velocity 152. As such, magnetized portion 106 is arranged closer to tunnel barrier 130 than tunnel barrier 132, which reduces a resistance and/or magnetoresistance between free layer 104 and a pinned layer below tunnel barrier 134.

Figure 2A:
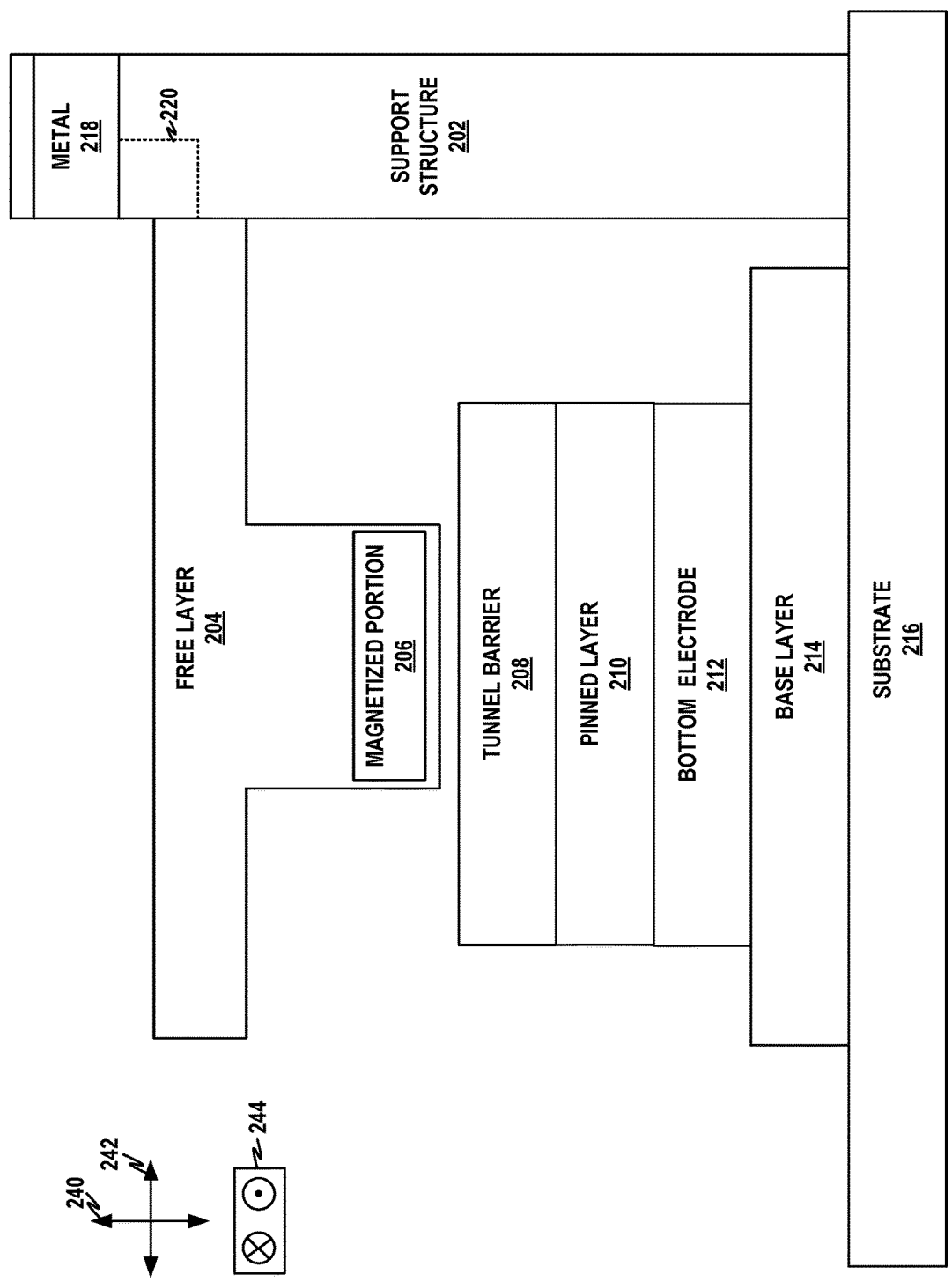
FIG. 2A shows a conceptual illustration of a cross-sectional view of a second MTJ element configured to detect gyroscopic motion.

FIG. 2A shows a conceptual illustration of a cross-sectional view of a second MTJ element 200 configured to detect gyroscopic motion. MTJ element 200 may include support structure 202, free layer 204, magnetized portion 206, tunnel barrier 208, pinned layer 210, bottom electrode 212, base layer 214, substrate 216, metal 218, and via 220, which may be examples of support structure 102, free layer 104, magnetized portion 106, tunnel barrier 108, pinned layer 110, bottom electrode 112, base layer 114, substrate 116, metal 118, and via 120 of FIG. 1, respectively.

FIG. 2B shows a conceptual illustration of a top-view of the second MTJ element 200 of FIG. 2A. In the example of FIGS. 2A and 2B, second MTJ element 200 includes tunnel barriers 230, 232, 234, and 235-238, each one of which may be substantially similar to tunnel barrier 108 of FIG. 1. Although not shown, each one of tunnel barriers 230, 232, 234, and 235-238 may include a corresponding pinned layer and bottom electrode. For example, each tunnel barrier of tunnel barriers 230, 232, 234, and 235-238 may be arranged above a respective pinned layer. As shown, tunnel barriers 208, 230, 232, 234, and 235-238 are arranged relative to free layer 204 to detect a circular motion 260. In some examples, tunnel barriers 230, 232, 234, and 235-238 may be arranged relative to free layer 204 to detect ovoid motion. In some examples, tunnel barriers 230, 232, 234, and 235-238 may be arranged relative to free layer 204 to detect quasi-circular motion.

In the example of FIGS. 2A and 2B, tunnel barrier 230 is arranged right of free layer 204 along first horizontal direction 242. In this example, tunnel barrier 232 is arranged left of free layer 204 along first horizontal direction 242. Said differently, for example, tunnel barrier 232 is arranged along first horizontal direction 242 on an opposite side of free layer 204 from tunnel barrier 230. In this example, tunnel barrier 208 is arranged below free layer 204 along second horizontal direction 244. In this example, tunnel barrier 234 is arranged above free layer 204 along second horizontal direction 244. Said differently, for example, tunnel barrier 208 is arranged along second horizontal direction 244 on an opposite side of free layer 204 from tunnel barrier 234.

Further, as shown, tunnel barrier 235 is arranged left of free layer 204 along first horizontal direction 242 and above free layer 204 along second horizontal direction 244. Tunnel barrier 236 may be arranged right of free layer 204 along first horizontal direction 242 and above free layer 204 along second horizontal direction 244. Tunnel barrier 237 is arranged left of free layer 204 along first horizontal direction 242 and below free layer 204 along second horizontal direction 244. Tunnel barrier 238 is arranged right of free layer 204 along first horizontal direction 242 and below free layer 204 along second horizontal direction 244.

FIG. 3A shows a conceptual illustration of a cross-sectional view of a third MTJ element 300 configured to detect gyroscopic motion. MTJ element 300 may include support structure 302, free layer 304, magnetized portion 306, tunnel barrier 308, pinned layer 310, bottom electrode 312, base layer 314, substrate 316, metal 318, and via 320, which may be examples of support structure 102, free layer 104, magnetized portion 106, tunnel barrier 108, pinned layer 110, bottom electrode 112, base layer 114, substrate 116, metal 118, and via 120 of FIG. 1, respectively.

In the example of FIG. 3A, free layer 304 is spaced next to tunnel barrier 308 along vertical direction 340. In some examples, magnetized portion 306 is spaced next to tunnel barrier 308 along vertical direction 340. For example, as shown, magnetized portion 306 may be arranged above pinned layer 310 and coplanar with tunnel barrier 308. As shown, free layer 304 and/or magnetized portion 306 may be arranged above pinned layer 310 along vertical direction 340.

Figure 3B:
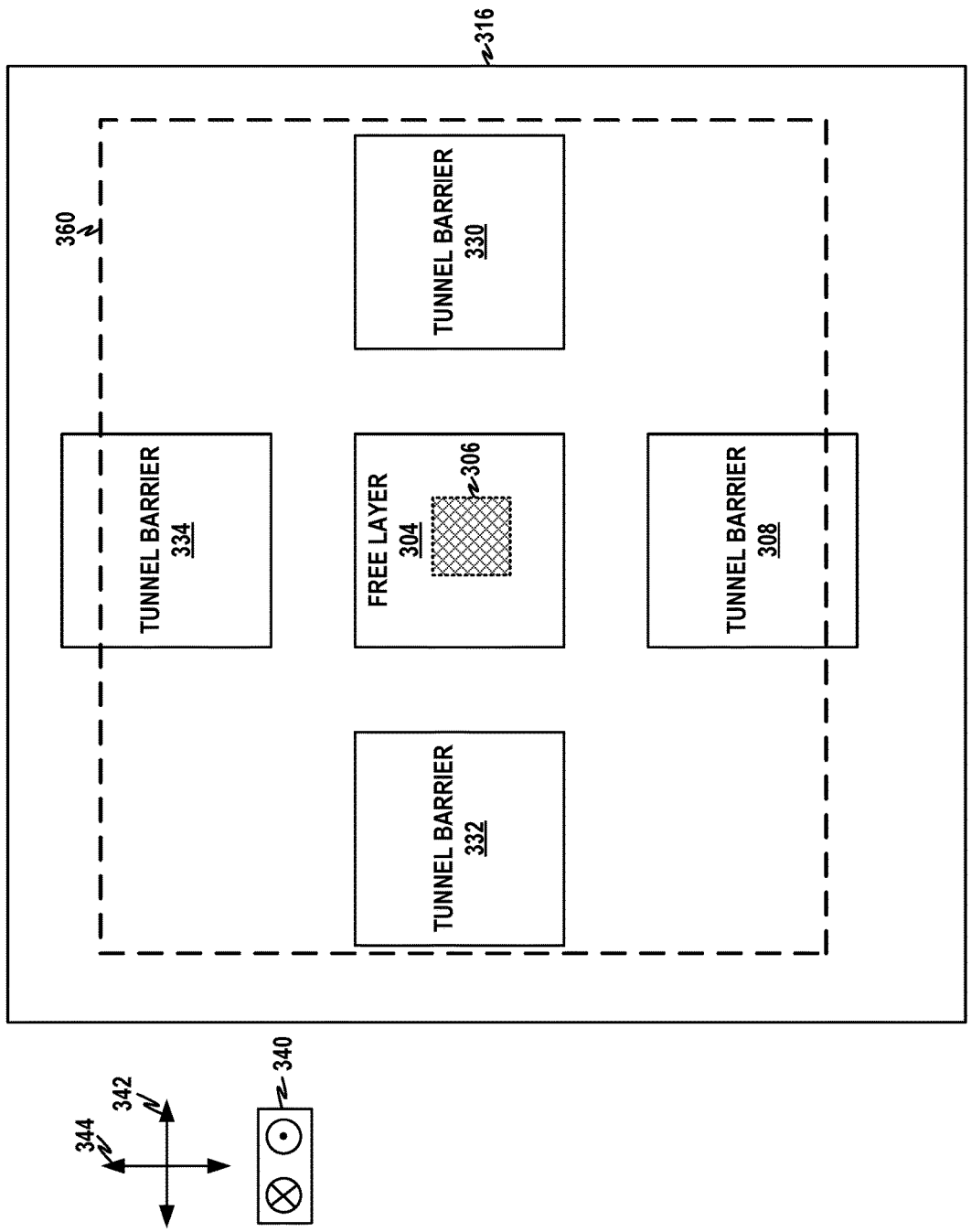
FIG. 3B shows a conceptual illustration of a top-view of the third MTJ element of FIG. 3A.

FIG. 3B shows a conceptual illustration of a top-view of the third MTJ element 300 of FIG. 3A. In the example of FIGS. 3A and 3B, third MTJ element 300 includes tunnel barriers 308, 330, 332, and 334, each one of which may be substantially similar to tunnel barrier 108 of FIG. 1. Although not shown, each one of tunnel barriers 330, 332, and 334 may include a corresponding pinned layer and bottom electrode. For example, each tunnel barrier of tunnel barriers 308, 330, 332, and 334 may be arranged above a respective pinned layer. As shown, tunnel barriers 308, 330, 332, and 334 (and respective pinned layers) are arranged relative to free layer 304 to detect a square motion 360. In some examples, tunnel barriers 308, 330, 332, and 334 (and respective pinned layers) may be arranged relative to free layer 304 to detect rectangular motion.

FIG. 4A shows a conceptual illustration of a cross-sectional view of a fourth MTJ element 400 configured to detect gyroscopic motion. MTJ element 400 may include support structure 402, free layer 404, magnetized portion 406, tunnel barrier 408, pinned layer 410, bottom electrode 412, base layer 414, substrate 416, metal 418, and via 420, which may be examples of support structure 102, free layer 104, magnetized portion 106, tunnel barrier 108, pinned layer 110, bottom electrode 112, base layer 114, substrate 116, metal 118, and via 120 of FIG. 1, respectively. In the example of FIG. 4A, free layer 404 is spaced next to tunnel barrier 408 along vertical direction 440. In some examples, magnetized portion 406 is spaced next to tunnel barrier 408 along vertical direction 440. For instance, as shown, magnetized portion 406 may be arranged above pinned layer 410 and coplanar with tunnel barrier 408. As shown, free layer 404 and/or magnetized portion 406 may be arranged above pinned layer 410 along vertical direction 440.

Figure 4B:
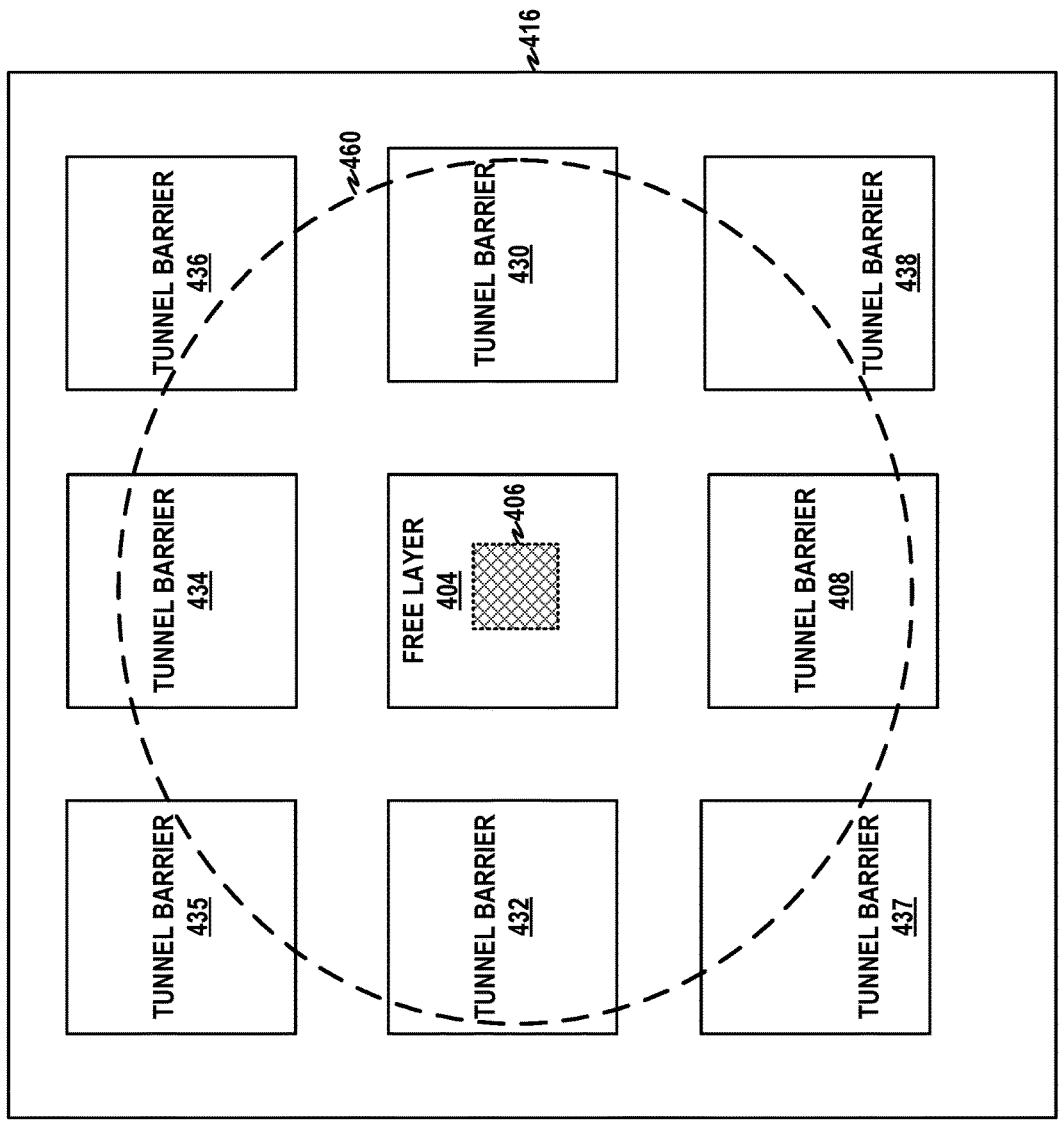
FIG. 4B shows a conceptual illustration of a top-view of the fourth MTJ element of FIG. 4A.

FIG. 4B shows a conceptual illustration of a top-view of the fourth MTJ element 400 of FIG. 4A. In the example of FIGS. 4A and 4B, MTJ element 400 includes tunnel barriers 430, 432, 434, and 435-438, each one of which may be substantially similar to tunnel barrier 108 of FIG. 1. Although not shown, each one of tunnel barriers 430, 432, 434, and 435-438 may include a corresponding pinned layer and bottom electrode. For example, each tunnel barrier of tunnel barriers 430, 432, 434, and 435-438 may be arranged above a respective pinned layer. As shown, tunnel barriers 408, 430, 432, 434, and 435-438 (and respective pinned layers) are arranged relative to free layer 404 to detect a circular motion 460. In some examples, tunnel barriers 430, 432, 434, and 435-438 (and respective pinned layers) may be arranged relative to free layer 404 to detect ovoid motion. In some examples, tunnel barriers 430, 432, 434, and 435-438 (and respective pinned layers) may be arranged relative to free layer 404 to detect quasi-circular motion.

In the example of FIGS. 4A and 4B, tunnel barrier 430 is arranged right of free layer 404 along first horizontal direction 442. In this example, tunnel barrier 432 is arranged left of free layer 404 along first horizontal direction 442. In this example, tunnel barrier 408 is arranged below free layer 404 along second horizontal direction 444. In this example, tunnel barrier 434 is arranged above free layer 404 along second horizontal direction 444. Further, as shown, tunnel barrier 435 is arranged left of free layer 404 along first horizontal direction 442 and above free layer 404 along second horizontal direction 444. Tunnel barrier 436 may be arranged right of free layer 404 along first horizontal direction 442 and above free layer 404 along second horizontal direction 444. Tunnel barrier 437 is arranged left of free layer 404 along first horizontal direction 442 and below free layer 404 along second horizontal direction 444. Tunnel barrier 438 is arranged right of free layer 404 along first horizontal direction 442 and below free layer 404 along second horizontal direction 444.

Figure 5A:
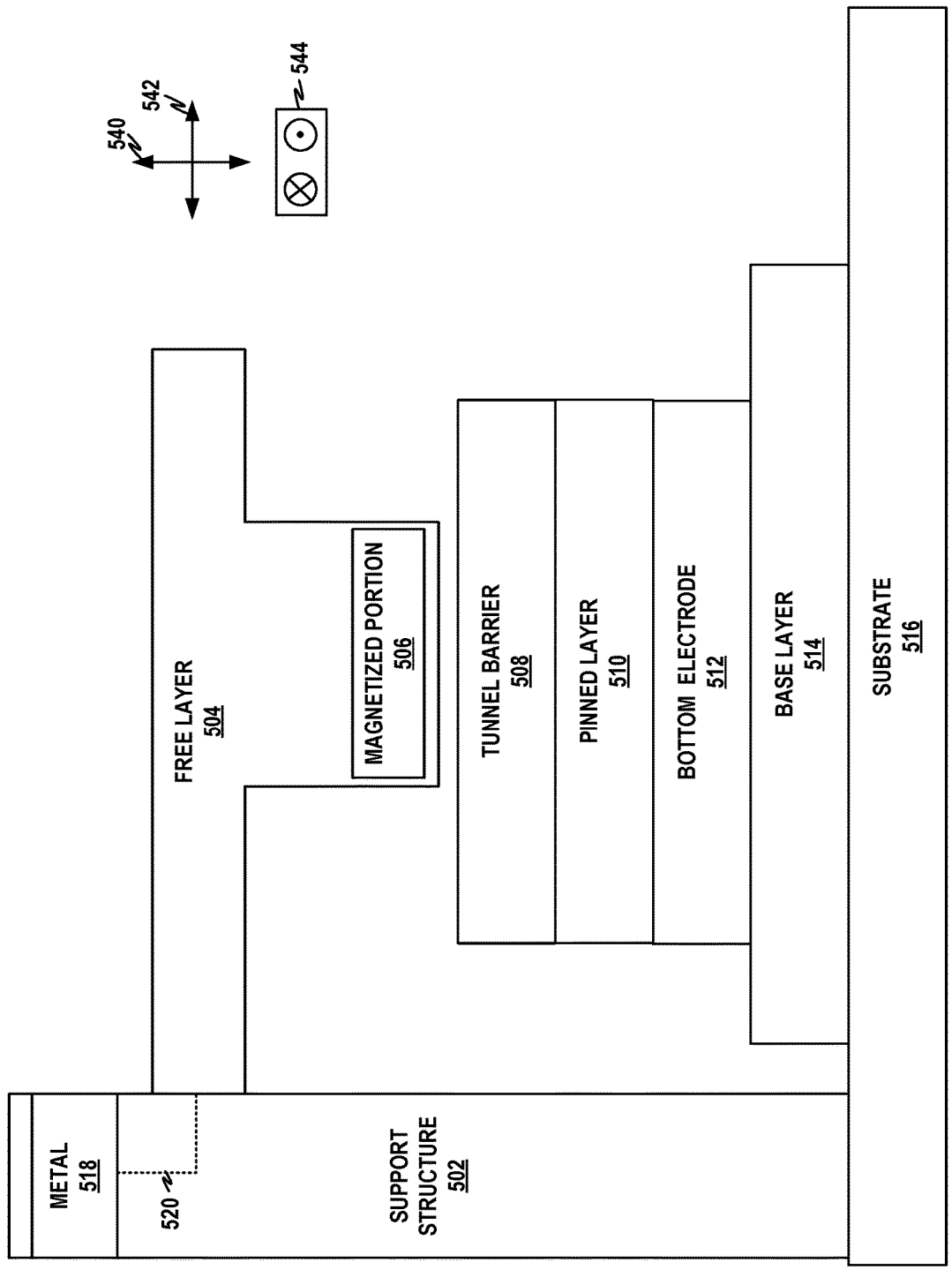
FIG. 5A shows a conceptual illustration of a cross-sectional view of a fifth MTJ element configured to detect gyroscopic motion.

FIG. 5A shows a conceptual illustration of a cross-sectional view of a fifth MTJ element 500 configured to detect gyroscopic motion. MTJ element 500 may include support structure 502, free layer 504, magnetized portion 506, tunnel barrier 508, pinned layer 510, bottom electrode 512, base layer 514, substrate 516, metal 518, and via 520, which may be examples of support structure 102, free layer 104, magnetized portion 106, tunnel barrier 108, pinned layer 110, bottom electrode 112, base layer 114, substrate 116, metal 118, and via 120 of FIG. 1, respectively. In the example of FIG. 5A, support structure 502 is arranged left of tunnel barrier 508 along first horizontal direction 542.

Figure 5B:
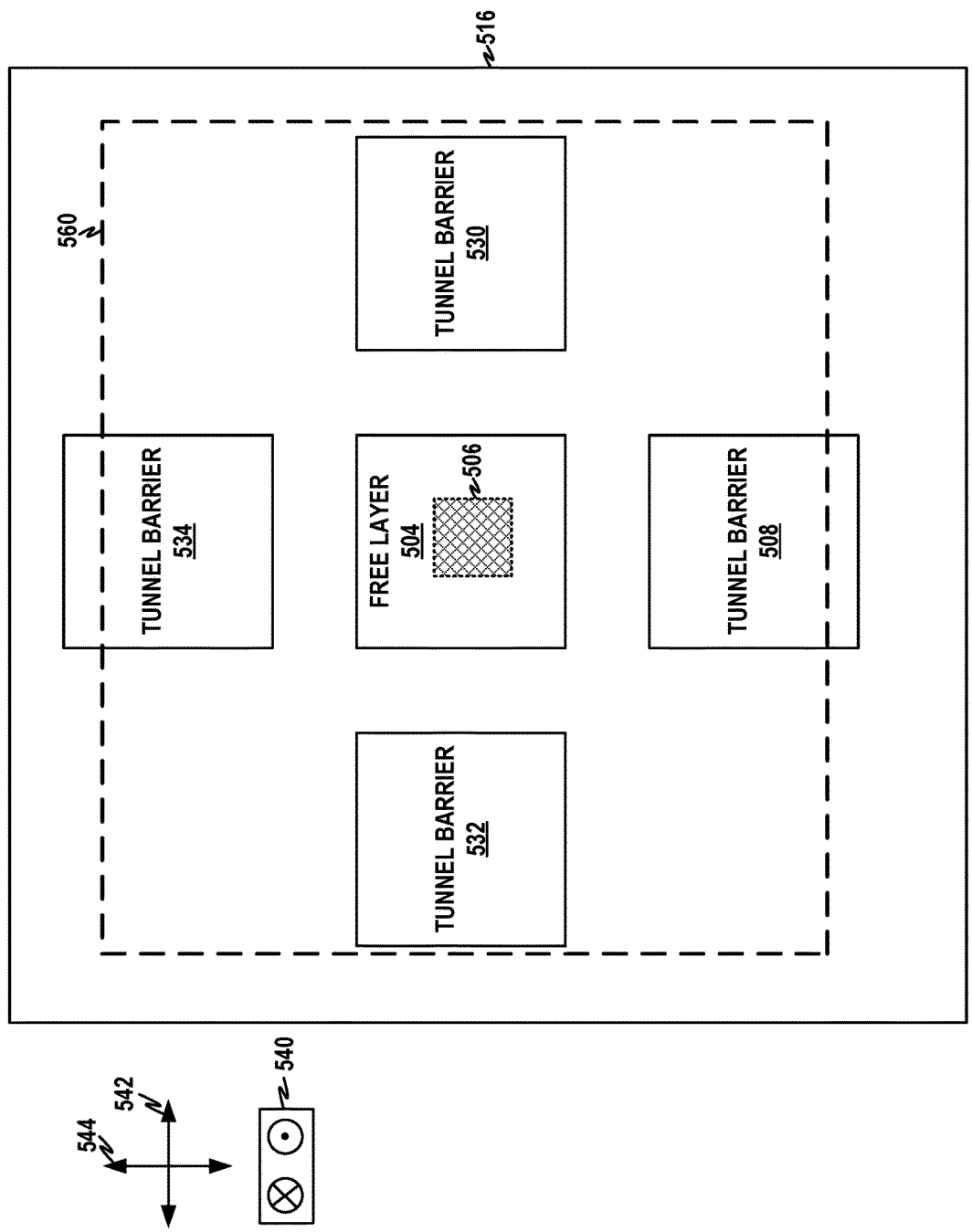
FIG. 5B shows a conceptual illustration of a top-view of the fifth MTJ element of FIG. 5A.

FIG. 5B shows a conceptual illustration of a top-view of the fifth MTJ element 500 of FIG. 5A. In the example of FIGS. 5A and 5B, fifth MTJ element 500 includes tunnel barriers 530, 532, and 534, each one of which may be substantially similar to tunnel barrier 508. Although not shown, each one of tunnel barriers 530, 532, and 534 may include a corresponding pinned layer and bottom electrode. For example, each tunnel barrier of tunnel barriers 530, 532, and 534 may be arranged above a respective pinned layer. As shown, tunnel barriers 508, 530, 532, and 534 (and respective pinned layers) are arranged relative to free layer 504 to detect a square motion 560. In some examples, tunnel barriers 508, 530, 532, and 534 (and respective pinned layers) may be arranged relative to free layer 504 to detect a rectangular motion.

As shown, tunnel barrier 530 is arranged right of free layer 504 along first horizontal direction 542. In this example, tunnel barrier 532 is arranged left of free layer 504 along first horizontal direction 542. In this example, tunnel barrier 508 is arranged below free layer 504 along second horizontal direction 544. In this example, tunnel barrier 534 is arranged above free layer 504 along second horizontal direction 544.

FIG. 6A shows a conceptual illustration of a cross-sectional view of a sixth MTJ element 600 configured to detect gyroscopic motion. MTJ element 600 may include support structure 602, free layer 604, magnetized portion 606, tunnel barrier 608, pinned layer 610, bottom electrode 612, base layer 614, substrate 616, metal 618, and via 620, which may be examples of support structure 102, free layer 104, magnetized portion 106, tunnel barrier 108, pinned layer 110, bottom electrode 112, base layer 114, substrate 116, metal 118, and via 120 of FIG. 1, respectively. In the example of FIG. 6A, support structure 602 is arranged left of tunnel barrier 608 along first horizontal direction 642.

Figure 6B:
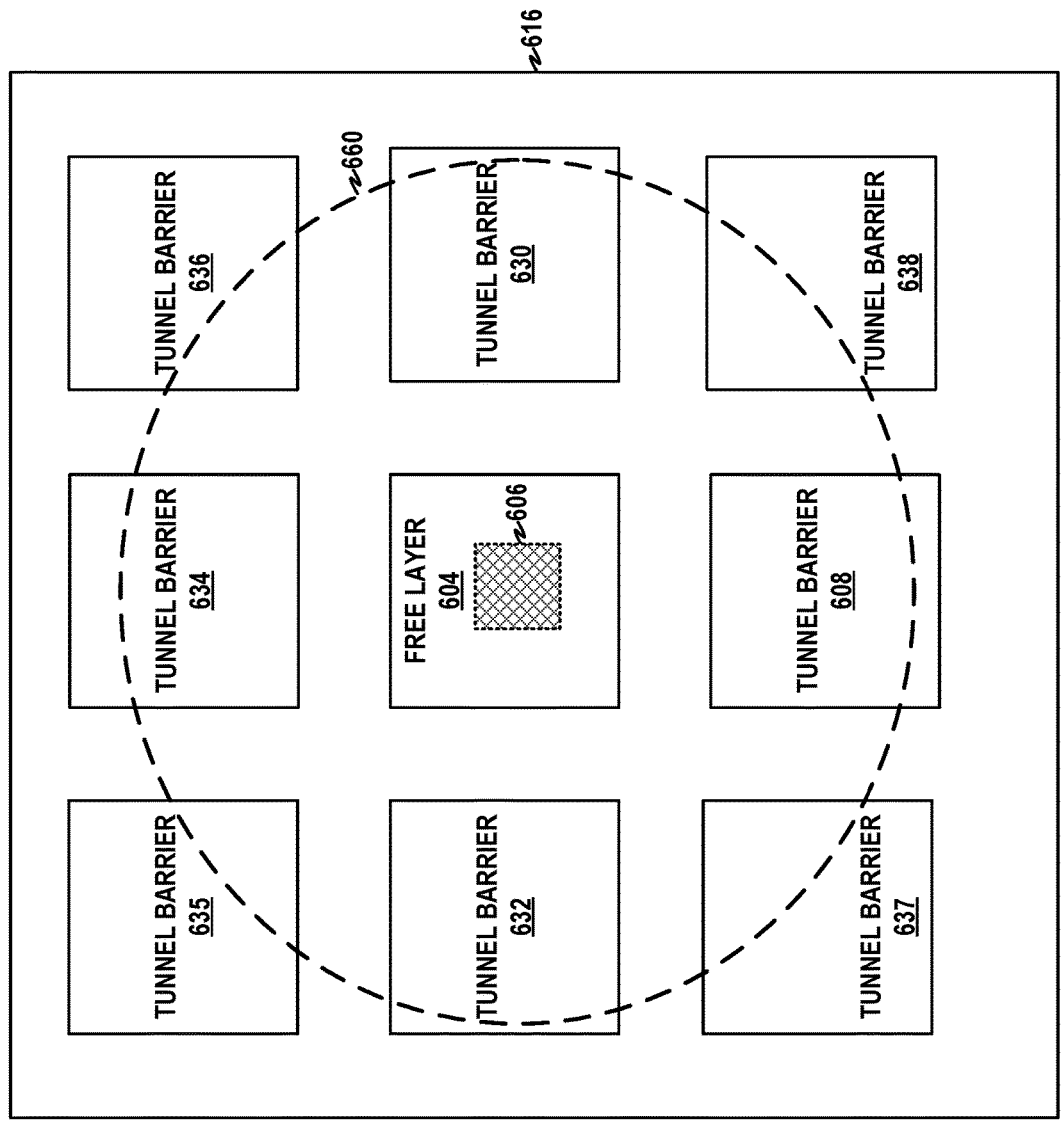
FIG. 6B shows a conceptual illustration of a top-view of the sixth MTJ element of FIG. 6A.

FIG. 6B shows a conceptual illustration of a top-view of the sixth MTJ element 600 of FIG. 6A. In the example of FIGS. 6A and 6B, MTJ element 600 includes tunnel barriers 630, 632, 634, and 635-638, each one of which may be substantially similar to tunnel barrier 108 of FIG. 1. Although not shown, each one of tunnel barriers 630, 632, 634, and 635-638 may include a corresponding pinned layer and bottom electrode. For example, each tunnel barrier of tunnel barriers 630, 632, 634, and 635-638 may be arranged above a respective pinned layer. As shown, tunnel barriers 608, 630, 632, 634, and 635-638 (and respective pinned layers) are arranged relative to free layer 604 to detect a circular motion 660. In some examples, tunnel barriers 630, 636, 634, and 635-638 (and respective pinned layers) may be arranged relative to free layer 604 to detect ovoid motion. In some examples, tunnel barriers 630, 632, 634, and 635-638 (and respective pinned layers) may be arranged relative to free layer 604 to detect quasi-circular motion.

In the example of FIGS. 6A and 6B, tunnel barrier 630 is arranged right of free layer 604 along first horizontal direction 642. In this example, tunnel barrier 632 is arranged left of free layer 604 along first horizontal direction 642. In this example, tunnel barrier 608 is arranged below free layer 604 along second horizontal direction 644. In this example, tunnel barrier 634 is arranged above free layer 604 along second horizontal direction 644. Further, as shown, tunnel barrier 635 is arranged left of free layer 604 along first horizontal direction 642 and above free layer 604 along second horizontal direction 644. Tunnel barrier 636 may be arranged right of free layer 604 along first horizontal direction 642 and above free layer 604 along second horizontal direction 644. Tunnel barrier 637 is arranged left of free layer 604 along first horizontal direction 642 and below free layer 604 along second horizontal direction 644. Tunnel barrier 638 is arranged right of free layer 604 along first horizontal direction 642 and below free layer 604 along second horizontal direction 644.

Figure 7A:
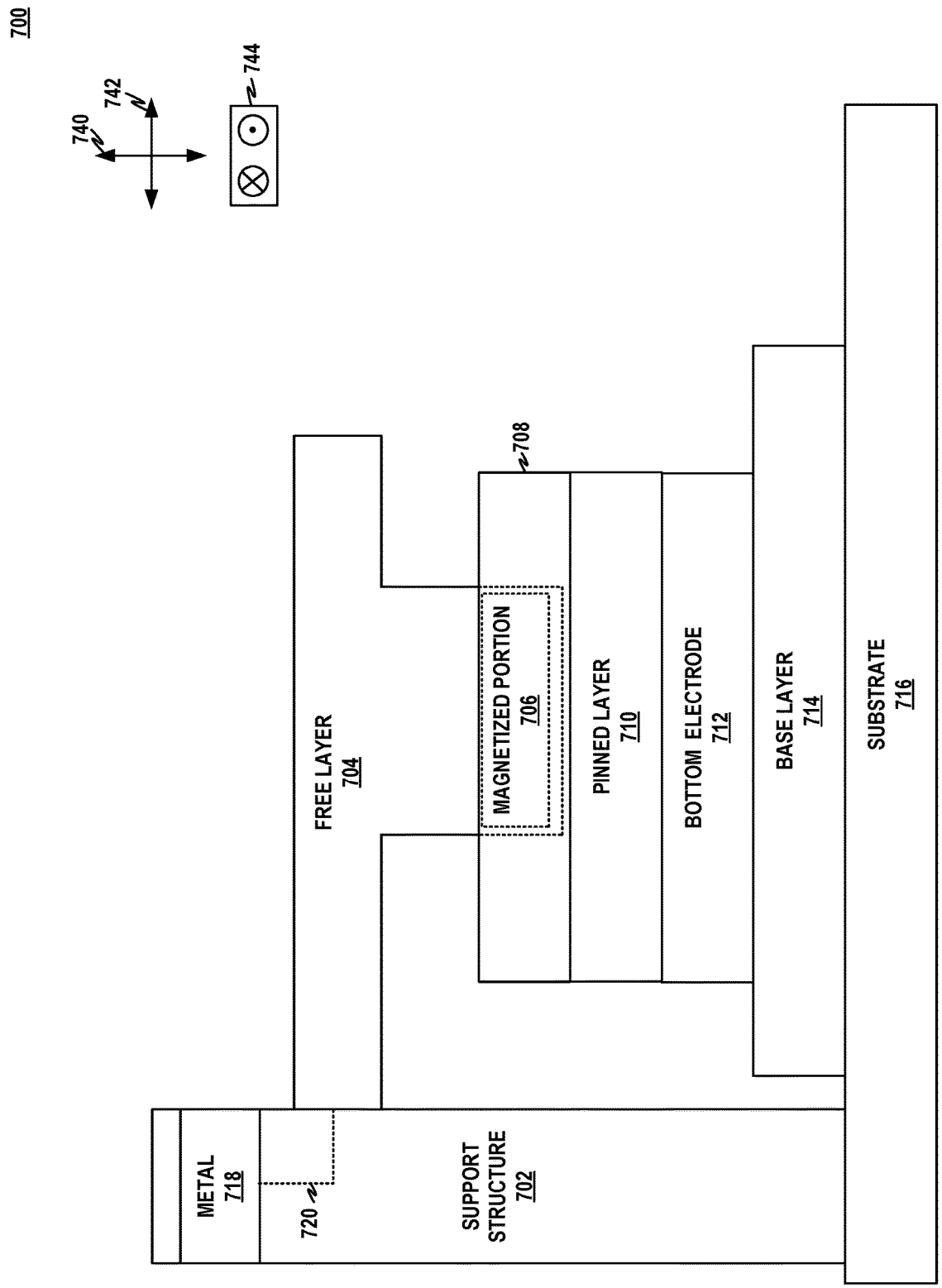
FIG. 7A shows a conceptual illustration of a cross-sectional view of a seventh MTJ element configured to detect gyroscopic motion.

FIG. 7A shows a conceptual illustration of a cross-sectional view of a seventh MTJ element 700 configured to detect gyroscopic motion. MTJ element 700 may include support structure 702, free layer 704, magnetized portion 706, tunnel barrier 708, pinned layer 710, bottom electrode 712, base layer 714, substrate 716, metal 718, and via 720, which may be examples of support structure 102, free layer 104, magnetized portion 106, tunnel barrier 108, pinned layer 110, bottom electrode 112, base layer 114, substrate 116, metal 118, and via 120 of FIG. 1, respectively. In the example of FIG. 7A, free layer 704 is spaced next to tunnel barrier 708 along vertical direction 740. In some examples, magnetized portion 706 is spaced next to tunnel barrier 708 along vertical direction 740. For instance, as shown, magnetized portion 706 may be arranged above pinned layer 710 and coplanar with tunnel barrier 708. In the example of FIG. 7A, support structure 702 is arranged left of tunnel barrier 708 along first horizontal direction 742.

Figure 7B:
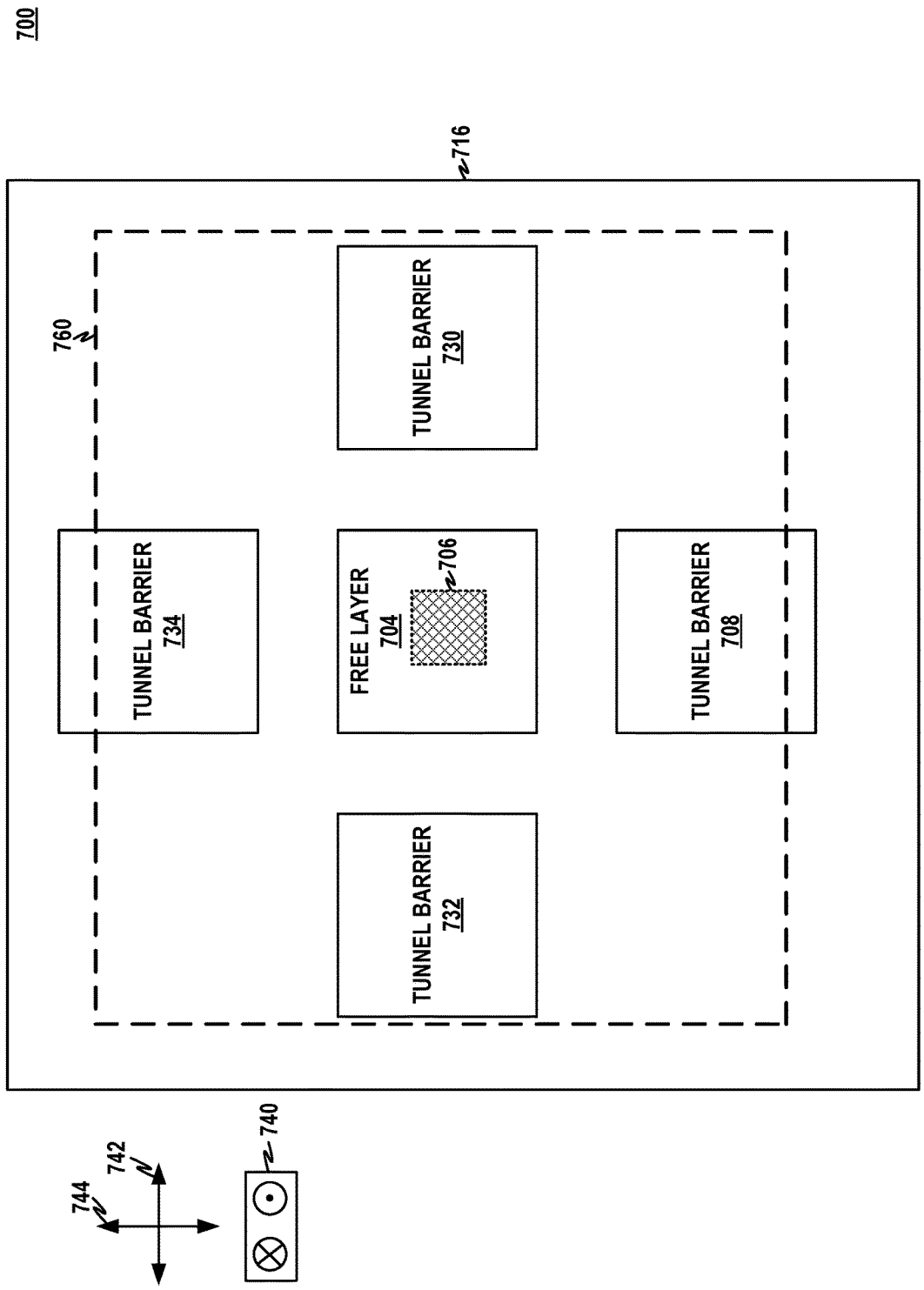
FIG. 7B shows a conceptual illustration of a top-view of the seventh MTJ element of FIG. 7A.

FIG. 7B shows a conceptual illustration of a top-view of the seventh MTJ element 700 of FIG. 7A. In the example of FIGS. 7A and 7B, seventh MTJ element 700 includes tunnel barriers 730, 732, and 734, each one of which may be substantially similar to tunnel barrier 708. Although not shown, each one of tunnel barriers 730, 732, and 734 may include a corresponding pinned layer and bottom electrode. For example, each tunnel barrier of tunnel barriers 730, 732, and 734 may be arranged above a respective pinned layer. As shown, tunnel barriers 708, 730, 732, and 734 (and respective pinned layers) are arranged relative to free layer 704 to detect a square motion 760. In some examples, tunnel barriers 708, 730, 732, and 734 (and respective pinned layers) may be arranged relative to free layer 704 to detect a rectangular motion.

As shown, tunnel barrier 730 is arranged right of free layer 704 along first horizontal direction 742. In this example, tunnel barrier 732 is arranged left of free layer 704 along first horizontal direction 742. In this example, tunnel barrier 708 is arranged below free layer 704 along second horizontal direction 744. In this example, tunnel barrier 734 is arranged above free layer 704 along second horizontal direction 744.

Figure 8A:
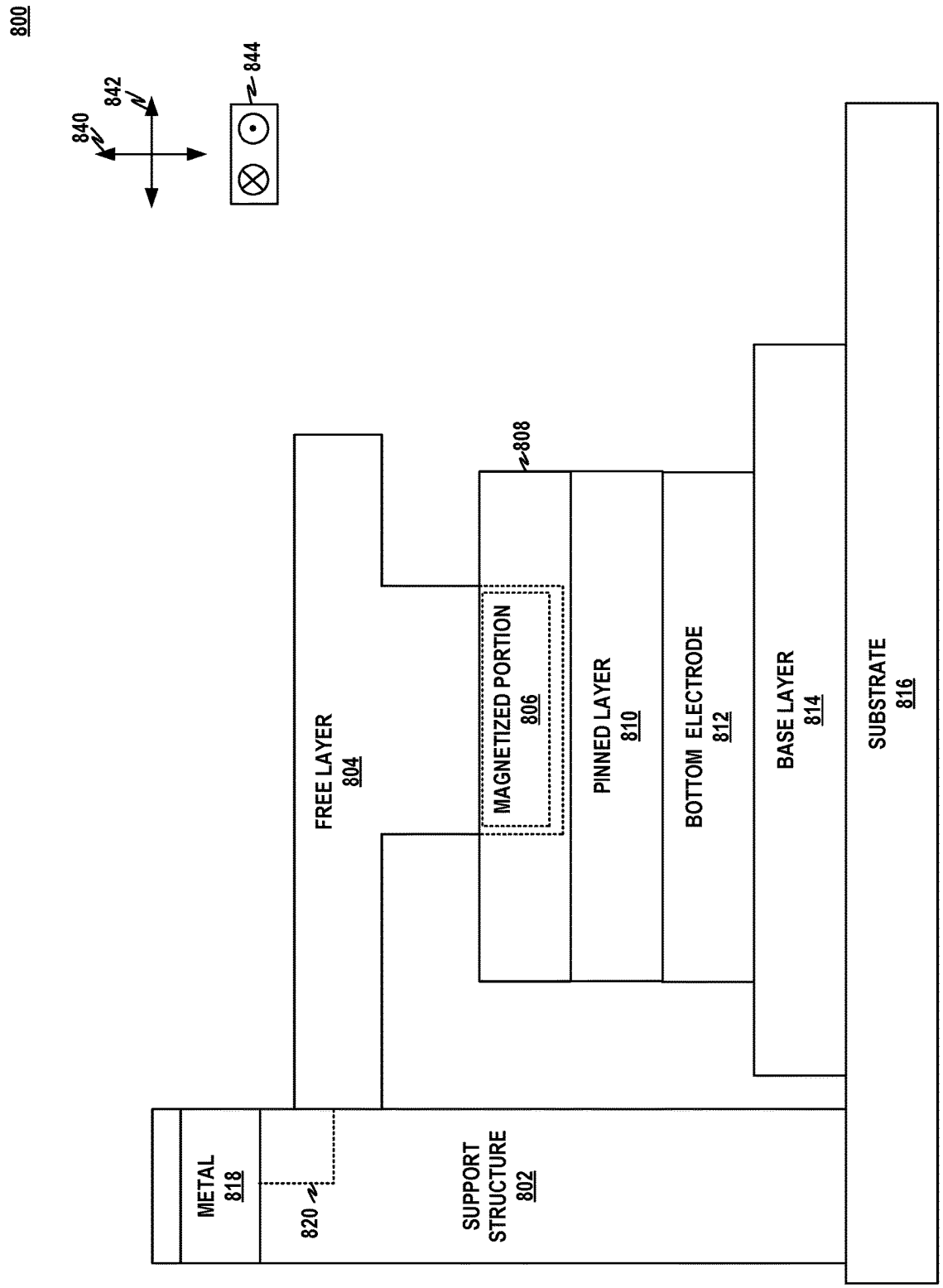
FIG. 8A shows a conceptual illustration of a cross-sectional view of an eighth MTJ element configured to detect gyroscopic motion.

FIG. 8A shows a conceptual illustration of a cross-sectional view of an eighth MTJ element 800 configured to detect gyroscopic motion. MTJ element 800 may include support structure 802, free layer 804, magnetized portion 806, tunnel barrier 808, pinned layer 810, bottom electrode 812, base layer 814, substrate 816, metal 818, and via 820, which may be examples of support structure 102, free layer 104, magnetized portion 106, tunnel barrier 108, pinned layer 110, bottom electrode 112, base layer 114, substrate 116, metal 118, and via 120 of FIG. 1, respectively. In the example of FIG. 8A, free layer 804 is spaced next to tunnel barrier 808 along vertical direction 840. For instance, as shown, magnetized portion 806 may be arranged above pinned layer 810 and coplanar with tunnel barrier 808. In some examples, magnetized portion 806 is spaced next to tunnel barrier 808 along vertical direction 840. In the example of FIG. 8A, support structure 802 is arranged left of tunnel barrier 808 along first horizontal direction 842.

Figure 8B:
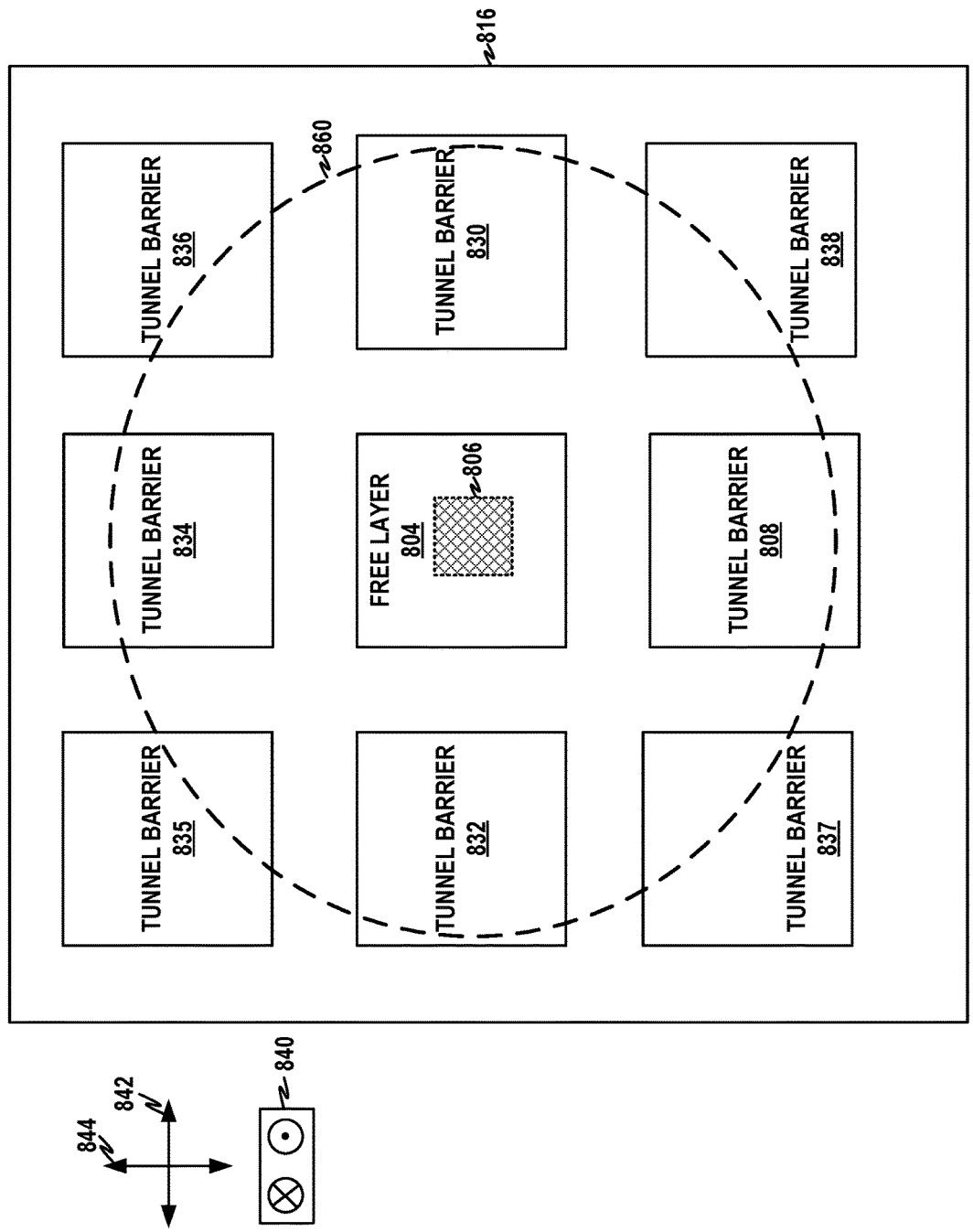
FIG. 8B shows a conceptual illustration of a top-view of the eighth MTJ element of FIG. 8A.

FIG. 8B shows a conceptual illustration of a top-view of the eighth MTJ element 800 of FIG. 8A. In the example of FIGS. 8A and 8B, eighth MTJ element 800 includes tunnel barriers 830, 832, 834, and 835-838, each one of which may be substantially similar to tunnel barrier 108 of FIG. 1. Although not shown, each one of tunnel barriers 830, 832, 834, and 835-838 may include a corresponding pinned layer and bottom electrode. For example, each tunnel barrier of tunnel barriers 830, 832, 834, and 835-838 may be arranged above a respective pinned layer. As shown, tunnel barriers 808, 830, 832, 834, and 835-838 (and respective pinned layers) are arranged relative to free layer 804 to detect a circular motion 860. In some examples, tunnel barriers 830, 838, 834, and 835-838 (and respective pinned layers) may be arranged relative to free layer 804 to detect ovoid motion. In some examples, tunnel barriers 830, 832, 834, and 835-838 (and respective pinned layers) may be arranged relative to free layer 804 to detect quasi-circular motion.

In the example of FIGS. 8A and 8B, tunnel barrier 830 is arranged right of free layer 804 along first horizontal direction 842. In this example, tunnel barrier 832 is arranged left of free layer 804 along first horizontal direction 842. In this example, tunnel barrier 808 is arranged below free layer 804 along second horizontal direction 844. In this example, tunnel barrier 834 is arranged above free layer 804 along second horizontal direction 844. Further, as shown, tunnel barrier 835 is arranged left of free layer 804 along first horizontal direction 842 and above free layer 804 along second horizontal direction 844. Tunnel barrier 836 may be arranged right of free layer 804 along first horizontal direction 842 and above free layer 804 along second horizontal direction 844. Tunnel barrier 837 is arranged left of free layer 804 along first horizontal direction 842 and below free layer 804 along second horizontal direction 844. Tunnel barrier 838 is arranged right of free layer 804 along first horizontal direction 842 and below free layer 804 along second horizontal direction 844.

FIG. 9A shows a conceptual illustration of a cross-sectional view of a ninth MTJ element 900 configured to detect gyroscopic motion. MTJ element 900 may include free layer 904, magnetized portion 906, tunnel barrier 908, pinned layer 910, bottom electrode 912, base layer 914, and substrate 916, which may be examples of free layer 104, magnetized portion 106, tunnel barrier 108, pinned layer 110, bottom electrode 112, base layer 114, and substrate 116 of FIG. 1, respectively.

In the example of FIG. 9A, free layer 904 extends from base layer 914 along vertical direction 940. As shown, pinned layer 910 is arranged above base layer 914 and free layer 904 extends along vertical direction 940 away from base layer 914. In this example, free layer 904 includes magnetized portion 906 arranged above pinned layer 910 and coplanar with tunnel barrier 908.

Figure 9B:
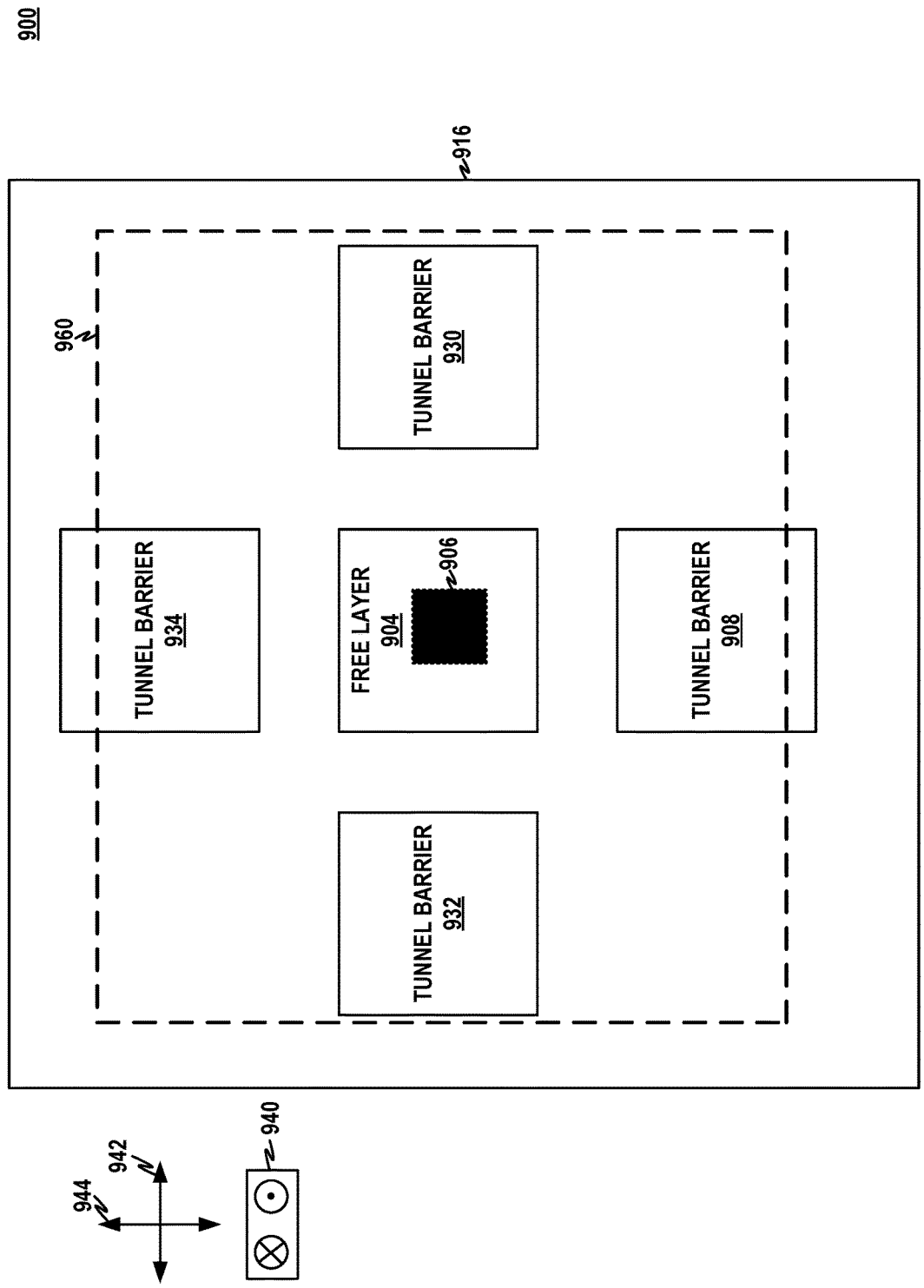
FIG. 9B shows a conceptual illustration of a top-view of the ninth MTJ element of FIG. 9A.

FIG. 9B shows a conceptual illustration of a top-view of the ninth MTJ element 900 of FIG. 9A. In the example of FIGS. 9A and 9B, MTJ element 900 includes tunnel barriers 930, 932, and 934, each one of which may be substantially similar to tunnel barrier 908. Although not shown, each one of tunnel barriers 930, 932, and 934 may include a corresponding pinned layer and bottom electrode. For example, each tunnel barrier of tunnel barriers 930, 932, and 934 may be arranged above a respective pinned layer. As shown, tunnel barriers 908, 930, 932, and 934 (and respective pinned layers) are arranged relative to free layer 904 to detect a square motion 960. In some examples, tunnel barriers 908, 930, 932, and 934 (and respective pinned layers) may be arranged relative to free layer 904 to detect a rectangular motion.

As shown, tunnel barrier 930 is arranged right of free layer 904 along first horizontal direction 942. In this example, tunnel barrier 932 is arranged left of free layer 904 along first horizontal direction 942. In this example, tunnel barrier 908 is arranged below free layer 904 along second horizontal direction 944. In this example, tunnel barrier 934 is arranged above free layer 904 along second horizontal direction 944.

FIG. 10A shows a conceptual illustration of a cross-sectional view of a tenth MTJ element 1000 configured to detect gyroscopic motion. MTJ element 1000 may include free layer 1004, magnetized portion 1006, tunnel barrier 1008, pinned layer 1010, bottom electrode 1012, base layer 1014, and substrate 1016, which may be examples of free layer 104, magnetized portion 106, tunnel barrier 108, pinned layer 110, bottom electrode 112, base layer 114, and substrate 116 of FIG. 1, respectively.

In the example of FIG. 10A, free layer 1004 extends from base layer 1014 along vertical direction 1040. As shown, pinned layer 1010 is arranged above base layer 1014 and free layer 1004 extends along vertical direction 1040 away from base layer 1014. In this example, free layer 1004 includes magnetized portion 1006 arranged above pinned layer 1010 and coplanar with tunnel barrier 1008.

Figure 10B:
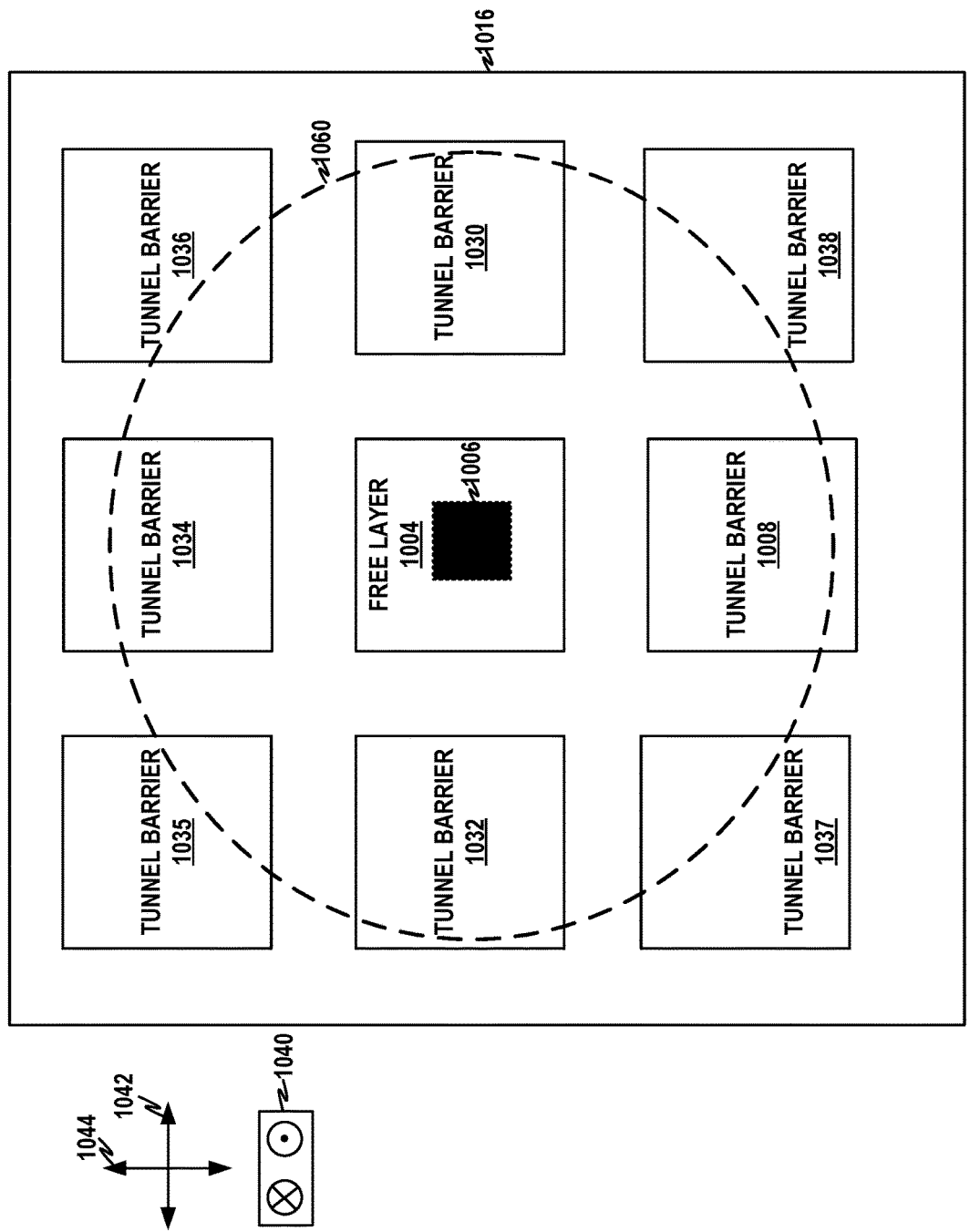
FIG. 10B shows a conceptual illustration of a top-view of the tenth MTJ element of FIG. 10A.

FIG. 10B shows a conceptual illustration of a top-view of the tenth MTJ element 1000 of FIG. 10A. In the example of FIGS. 10A and 10B, MTJ element 1000 includes tunnel barriers 1030, 1032, 1034, and 1035-1038, each one of which may be substantially similar to tunnel barrier 108 of FIG. 1. Although not shown, each one of tunnel barriers 1030, 1032, 1034, and 1035-1038 may include a corresponding pinned layer and bottom electrode. For example, each tunnel barrier of tunnel barriers 1030, 1032, 1034, and 1035-1038 (and respective pinned layers) may be arranged above a respective pinned layer. As shown, tunnel barriers 1008, 1030, 1032, 1034, and 1035-1038 are arranged relative to free layer 1004 to detect a circular motion 1060. In some examples, tunnel barriers 1030, 1038, 1034, and 1035-1038 (and respective pinned layers) may be arranged relative to free layer 1004 to detect ovoid motion. In some examples, tunnel barriers 1030, 1032, 1034, and 1035-1038 may be arranged relative to free layer 1004 to detect quasi-circular motion.

In the example of FIGS. 10A and 10B, tunnel barrier 1030 is arranged right of free layer 1004 along first horizontal direction 1042. In this example, tunnel barrier 1032 is arranged left of free layer 1004 along first horizontal direction 1042. In this example, tunnel barrier 1008 is arranged below free layer 1004 along second horizontal direction 1044. In this example, tunnel barrier 1034 is arranged above free layer 1004 along second horizontal direction 1044. Further, as shown, tunnel barrier 1035 is arranged left of free layer 1004 along first horizontal direction 1042 and above free layer 1004 along second horizontal direction 1044. Tunnel barrier 1036 may be arranged right of free layer 1004 along first horizontal direction 1042 and above free layer 1004 along second horizontal direction 1044. Tunnel barrier 1037 is arranged left of free layer 1004 along first horizontal direction 1042 and below free layer 1004 along second horizontal direction 1044. Tunnel barrier 1038 is arranged right of free layer 1004 along first horizontal direction 1042 and below free layer 1004 along second horizontal direction 1044.

Figure 11:
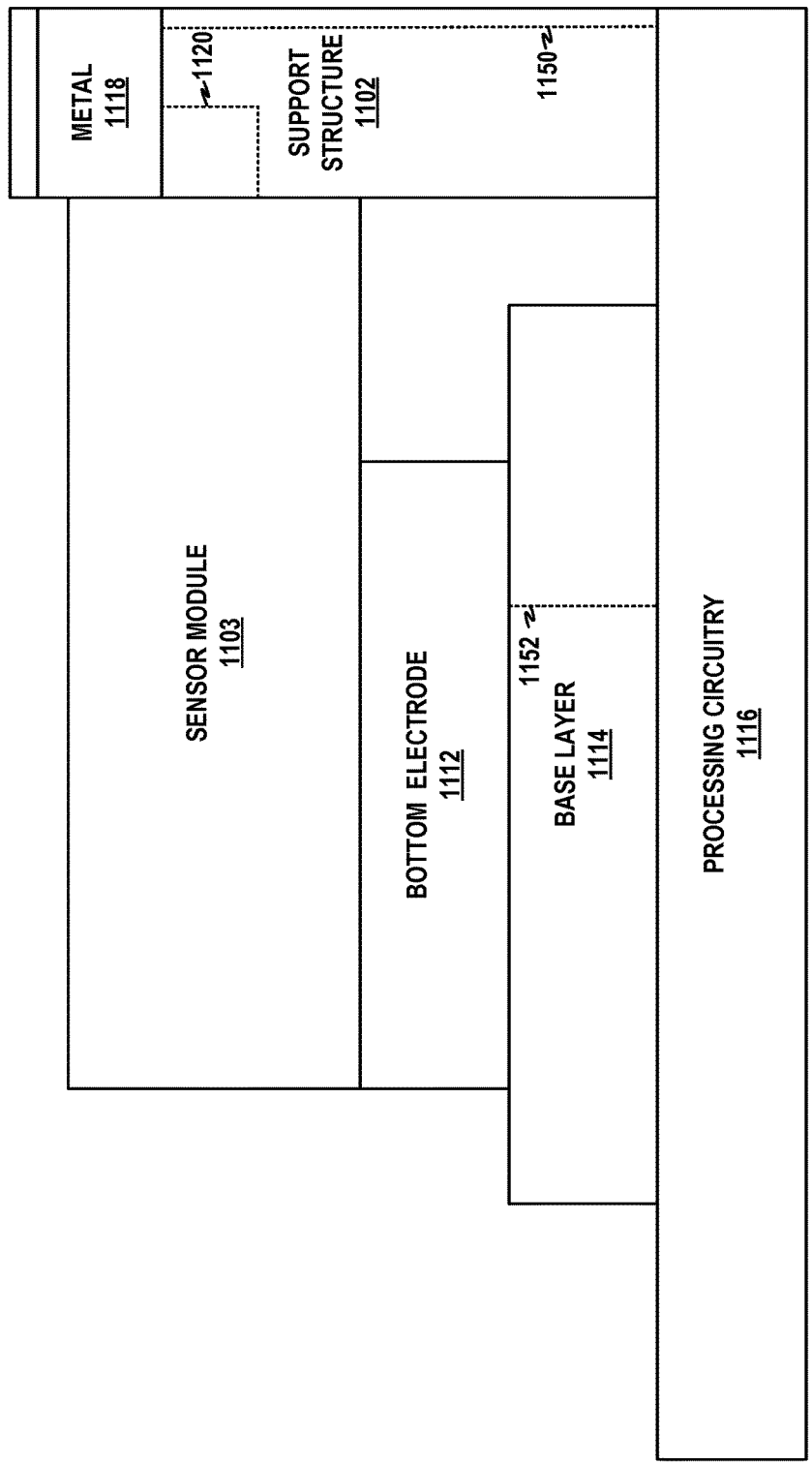
FIG. 11 shows a conceptual illustration of a first gyroscopic sensor device that may be used to implement the techniques of the present disclosure.

FIG. 11 shows a conceptual illustration of a first gyroscopic sensor device 1100 that may be used to implement the techniques of the present disclosure. Gyroscopic sensor device 1100 may include support structure 1102, bottom electrode 1112, base layer 1114, processing circuitry 1116, metal 1118, and via 1120, which may be examples of support structure 102, bottom electrode 112, base layer 114, substrate 116, metal 118, and via 120 of FIG. 1, respectively. Gyroscopic sensor device 1100 may further include sensor module 1103, which may comprise a free layer, one or more tunnel barriers, and one or more pinned layers arranged for detecting gyroscopic motion using a support structure (e.g., see FIGS. 1A-1D, 2A-2B, 3A-3B, 4A-4B, 5A-5B, 6A-6B, 7A-7B, and 8A-8B). For example, while FIG. 11 illustrates a single bottom electrode, some examples, may include two or more (e.g., 4, 8, etc.) bottom electrodes that are each connected to a respective pinned layer and a respective tunnel barrier.

Sensor devices implementing one or more of the techniques described in this disclosure may be implemented in a wide array of electronic devices ranging from small portable devices such as music players, smart phones, game cartridges, and memory sticks up to larger devices such as tablet computers, gaming devices or consoles, desktop computers, super computers, and enterprise storage solutions.

Support structure 1102 may include via 1150 adapted to electrically couple a free layer of sensor module 1103 to processing circuitry 1116. Via 1150 and via 1152 may be formed of an electrically conductive material, such as, for example, but not limited to, tungsten, aluminum, aluminum-copper, and/or copper. In the example of FIG. 11, via 1150 electrically connects metal 1118 to processing circuitry 1116. In this example, via 1152 electrically connects bottom electrode 1112 to processing circuitry 1116.

Processing circuitry 1116 is configured to monitor the resistance(s) and/or magnetoresistance(s) of sensor module 1103, which may correspond to gyroscopic motion of gyroscopic sensor device 1100. This monitoring of the resistance(s) and/or magnetoresistance(s) is termed Rmonitor, which represents the real time measuring of the MTJ element resistance(s) and/or magnetoresistance(s). For example, processing circuitry 1116 may determine an angular velocity is increasing as a magnitude of resistance and/or magnetoresistance between a free layer and a particular pinned layer of sensor module 1103 decreases.

Processing circuitry 1116 may be adapted to compare two or more respective resistances between each pinned layer and the free layer to determine gyroscopic motion. For example, processing circuitry 1116 may compare a first resistance between a respective pinned layer for tunnel barrier 130 and free layer 104 to a second resistance between a respective pinned layer for tunnel barrier 132 and free layer 104 to determine gyroscopic motion along first horizontal direction 142. In some examples, processing circuitry 1116 may compare a third resistance between a respective pinned layer for tunnel barrier 108 and free layer 104 to a fourth resistance between a respective pinned layer for tunnel barrier 134 and free layer 104 to determine gyroscopic motion along second horizontal direction 144.

Processing circuitry 1116 may be adapted to determine gyroscopic motion has occurred along first horizontal direction 142. For example, processing circuitry 1116 may determine gyroscopic motion has occurred along first horizontal direction 142 when a first resistance between a respective pinned layer for tunnel barrier 130 and free layer 104 is greater than a second resistance between a respective pinned layer for tunnel barrier 132 and free layer 104. Similarly, processing circuitry 1116 may determine gyroscopic motion has occurred along first horizontal direction 142 when a first resistance between a respective pinned layer for tunnel barrier 130 and free layer 104 is less than a second resistance between a respective pinned layer for tunnel barrier 132 and free layer 104.

Processing circuitry 1116 may be adapted to determine gyroscopic motion has occurred along second horizontal direction 144. For example, processing circuitry 1116 may determine gyroscopic motion has occurred along second horizontal direction 144 when a third resistance between a respective pinned layer for tunnel barrier 108 and free layer 104 is greater than a fourth resistance between a respective pinned layer for tunnel barrier 134 and free layer 104 to determine gyroscopic motion along second horizontal direction 144. Similarly, processing circuitry 1116 may determine gyroscopic motion has occurred along second horizontal direction 144 when a third resistance between a respective pinned layer for tunnel barrier 108 and free layer 104 is less than a fourth resistance between a respective pinned layer for tunnel barrier 134 and free layer 104 to determine gyroscopic motion along second horizontal direction 144.

Processing circuitry 1116 may be adapted to output an indication of the gyroscopic motion. For example, processing circuitry 1116 may generate a digital signal indicating gyroscopic motion along first horizontal direction 142 and/or second horizontal direction 144. In some examples, processing circuitry 1116 may generate one or more voltages magnitudes indicating gyroscopic motion along first horizontal direction 142 and/or second horizontal direction 144.

Processing circuitry 1116 may include one or more processors, including one or more microprocessors, digital signal processors (DSPs), ASICs, field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. Although the foregoing examples are directed to MTJ element 100 of FIGS. 1A-1D, other examples may use other MTJ elements (e.g., 2A-2B, 3A-3B, 4A-4B. 5A-5B, 6A-6B, 7A-7B, 8A-8B, etc.)

Figure 12:
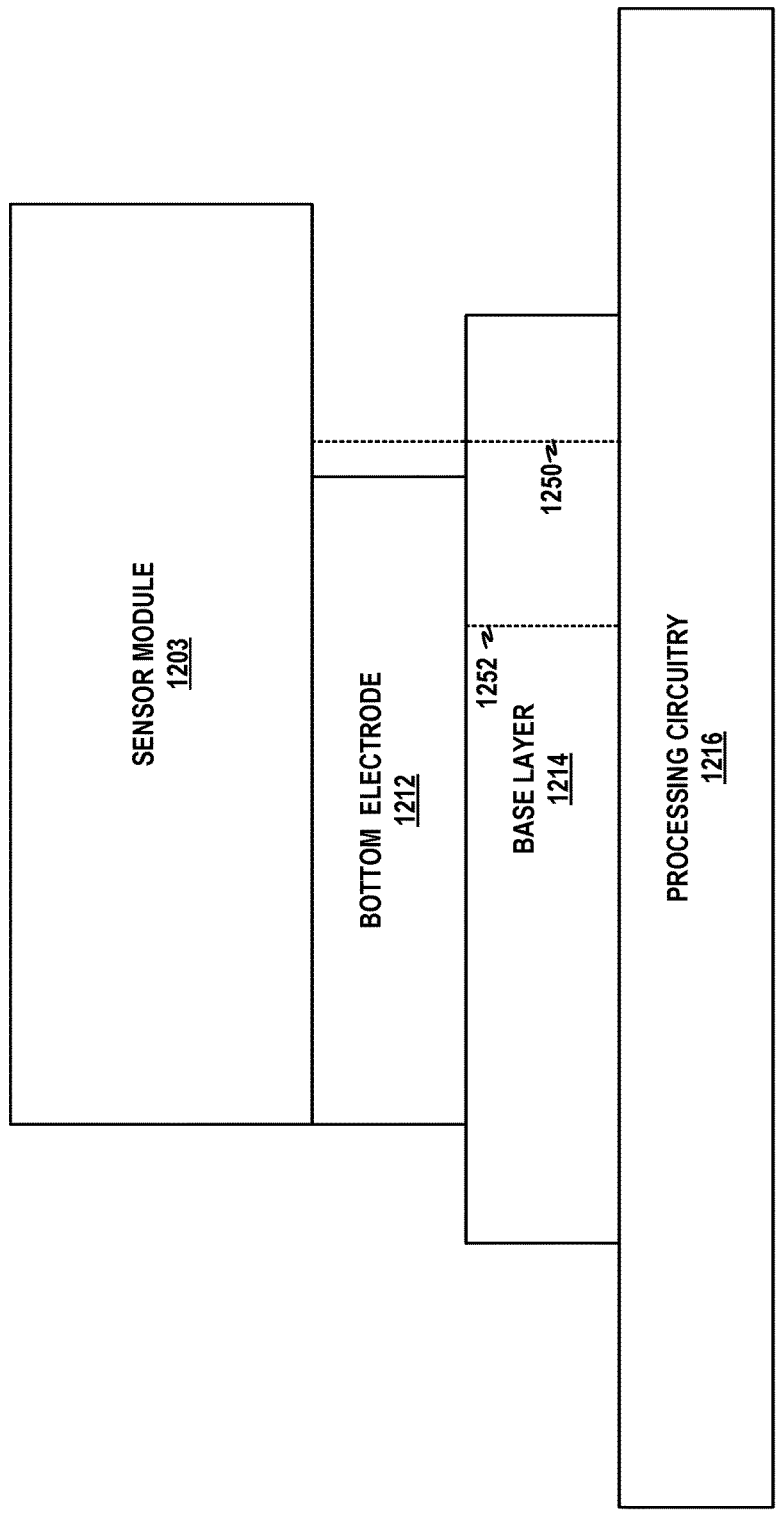
FIG. 12 shows a conceptual illustration of a second gyroscopic sensor device that may be used to implement the techniques of the present disclosure.

FIG. 12 shows a conceptual illustration of a second gyroscopic sensor device 1200 that may be used to implement the techniques of the present disclosure. Gyroscopic sensor device 1200 may include bottom electrode 1212, base layer 1214, and processing circuitry 1216, which may be examples of bottom electrode 112, base layer 114, and substrate 116 of FIG. 1, respectively. Gyroscopic sensor device 1200 may further include sensor module 1203, which may comprise a free layer, one or more tunnel barriers, and one or more pinned layers arranged for detecting gyroscopic motion (e.g., see FIGS. 9A-9B, and 10A-10B). For example, while FIG. 12 illustrates a single bottom electrode, some examples, may include two or more (e.g., 4, 8, etc.) bottom electrodes that are each connected to a respective pinned layer and a respective tunnel barrier.

Sensor devices implementing one or more of the techniques described in this disclosure may be implemented in a wide array of electronic devices ranging from small portable devices such as music players, smart phones, game cartridges, and memory sticks up to larger devices such as tablet computers, gaming devices or consoles, desktop computers, super computers, and enterprise storage solutions.

In the example of FIG. 12, base layer 1214 comprises via 1250 adapted to electrically couple a free layer of sensor module 1203 to processing circuitry 1216. Via 1250 and via 1252 may be formed of an electrically conductive material, such as, for example, but not limited to, copper. In the example of FIG. 12, via 1250 electrically connects a free layer of sensor module 1203 to processing circuitry 1216. In this example, via 1252 electrically connects bottom electrode 1212 to processing circuitry 1216.

Processing circuitry 1216 is configured to monitor the resistance(s) and/or magnetoresistance(s) of sensor module 1203, which may correspond to gyroscopic motion of gyroscopic sensor device 1200. This monitoring of the resistance(s) and/or magnetoresistance(s) is termed Rmonitor, which represents the real time measuring of the MTJ element resistance(s) and/or magnetoresistance(s). For example, processing circuitry 1216 may determine an angular velocity is increasing as a magnitude of resistance and/or magnetoresistance between a free layer and a particular tunnel barrier of sensor module 1203 decreases.

Processing circuitry 1216 may be adapted to compare two or more respective resistances between each pinned layer and the free layer to determine gyroscopic motion. For example, processing circuitry 1216 may compare a first resistance between a respective pinned layer for tunnel barrier 930 and free layer 904 to a second resistance between a respective pinned layer for tunnel barrier 932 and free layer 904 to determine gyroscopic motion along first horizontal direction 942. In some examples, processing circuitry 1216 may compare a third resistance between a respective pinned layer for tunnel barrier 908 and free layer 904 to a fourth resistance between a respective pinned layer for tunnel barrier 934 and free layer 904 to determine gyroscopic motion along second horizontal direction 944.

Processing circuitry 1216 may be adapted to determine gyroscopic motion has occurred along first horizontal direction 942. For example, processing circuitry 1216 may determine gyroscopic motion has occurred along first horizontal direction 942 when a first resistance between a respective pinned layer for tunnel barrier 930 and free layer 904 is greater than a second resistance between a respective pinned layer for tunnel barrier 932 and free layer 904. Similarly, processing circuitry 1216 may determine gyroscopic motion has occurred along first horizontal direction 942 when a first resistance between a respective pinned layer for tunnel barrier 930 and free layer 904 is less than a second resistance between a respective pinned layer for tunnel barrier 932 and free layer 904.

Processing circuitry 1216 may be adapted to determine gyroscopic motion has occurred along second horizontal direction 944. For example, processing circuitry 1216 may determine gyroscopic motion has occurred along second horizontal direction 944 when a third resistance between a respective pinned layer for tunnel barrier 908 and free layer 904 is greater than a fourth resistance between a respective pinned layer for tunnel barrier 934 and free layer 904 to determine gyroscopic motion along second horizontal direction 944. Similarly, processing circuitry 1216 may determine gyroscopic motion has occurred along second horizontal direction 944 when a third resistance between a respective pinned layer for tunnel barrier 908 and free layer 904 is less than a fourth resistance between a respective pinned layer for tunnel barrier 934 and free layer 904 to determine gyroscopic motion along second horizontal direction 944.

Processing circuitry 1216 may be adapted to output an indication of the gyroscopic motion. For example, processing circuitry 1216 may generate a digital signal indicating gyroscopic motion along first horizontal direction 942 and/or second horizontal direction 944. In some examples, processing circuitry 1216 may generate one or more voltages magnitudes indicating gyroscopic motion along first horizontal direction 942 and/or second horizontal direction 944.

Processing circuitry 1216 may include one or more processors, including one or more microprocessors, digital signal processors (DSPs), ASICs, field programmable gate arrays (FPGAs), or any other equivalent integrated or discrete logic circuitry, as well as any combinations of such components. Although the foregoing examples are directed to MTJ element 100 of FIGS. 1A-1D, other examples may use other MTJ elements (e.g., 2A-2B, 3A-3B, 4A-4B. 5A-5B, 6A-6B, 7A-7B, 8A-8B, etc.)

Figure 13:
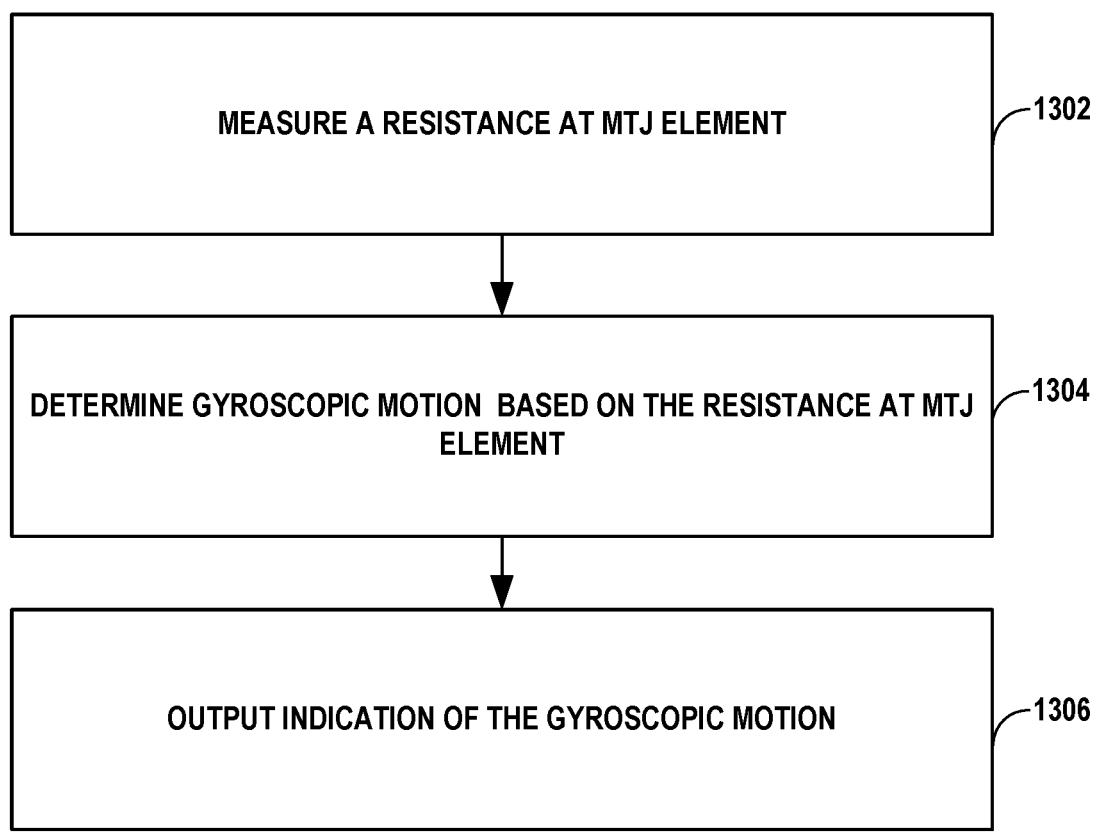
FIG. 13 shows a flowchart of operations for detecting gyroscopic motion in accordance with the techniques of this disclosure.

FIG. 13 shows a flowchart of operations for detecting gyroscopic motion in accordance with the techniques of this disclosure. The operations of FIG. 13 may, for example, be performed by a MTJ element described above with respect to any combination of FIGS. 1A-1D, 2A-2B, 3A-3B, 4A-4B. 5A-5B, 6A-6B, 7A-7B, 8A-8B, 9A-9B, 10A-10B, 11, and 12. Processing circuitry 1116 and/or processing circuitry 1216 measures a resistance at a MTJ element (1302). Processing circuitry 1116 and/or processing circuitry 1216 determines gyroscopic motion based on the resistance at the MTJ element (1304). For instance, processing circuitry 1116 and/or processing circuitry 1216 determines gyroscopic motion based on a resistance at sensor module 1103 and/or sensor module 1203. Processing circuitry 1116 and/or processing circuitry 1216 outputs an indication of the gyroscopic motion (1306).

The term "circuitry" as used herein may refer to any of the foregoing structure or any other structure suitable for processing program code and/or data or otherwise implementing the techniques described herein. Circuitry may, for example, any of a variety of types of solid state circuit elements, such as CPUs, CPU cores, GPUs, DSPs, ASICs, mixed-signal integrated circuits, FPGAs, microcontrollers, programmable logic controllers (PLCs), programmable logic device (PLDs), complex PLDs (CPLDs), systems on a chip (SoC), any subsection of any of the above, an interconnected or distributed combination of any of the above, or any other integrated or discrete logic circuitry, or any other type of component or one or more components capable of being configured in accordance with any of the examples disclosed herein.

As used in this disclosure, circuitry may also include one or more memory devices, such as any volatile or non-volatile media, such as a RAM, ROM, non-volatile RAM (NVRAIVI), electrically erasable programmable ROM (EEPROM), flash memory, and the like. The one or more memory devices may store computer-readable instructions that, when executed or processed the circuitry, cause the circuitry to implement the techniques attributed herein to circuitry. The circuitry of this disclosure may be programmed, or otherwise controlled, with various forms of firmware and/or software.

Various illustrative aspects of the disclosure have been described above. These and other aspects are within the scope of the following claims.

The invention claimed is:

1. A magnetic tunnel junction (MTJ) based sensor device, the device comprising:
    a MTJ element comprising a free layer, a pinned layer, and a tunnel barrier, the tunnel barrier being arranged above the pinned layer, wherein the free layer is adapted to flex away from the tunnel barrier during gyroscopic motion; and
    processing circuitry configured to:
        measure a resistance at the MTJ element; and
        determine gyroscopic motion based on the resistance at the MTJ element.

2. The device of claim 1, wherein the MTJ element comprises a support structure adapted to arrange the free layer above the tunnel barrier.

3. The device of claim 2, wherein the free layer comprises a magnetized portion arranged above the tunnel barrier.

4. The device of claim 2, wherein the free layer comprises a magnetized portion arranged above the pinned layer and coplanar with the tunnel barrier.

5. The device of claim 2, wherein the support structure comprises a via adapted to electrically couple the free layer to processing circuitry.

6. The device of claim 1, wherein the MTJ element comprises:
    a base layer, wherein the pinned layer is arranged above the base layer, and wherein the free layer extends along a vertical direction away from the base layer.

7. The device of claim 6, wherein the free layer comprises a magnetized portion arranged above the pinned layer and coplanar with the tunnel barrier.

8. The device of claim 6, wherein the base layer comprises a via adapted to electrically couple the free layer to processing circuitry.

9. The device of claim 1, wherein the MTJ element comprises:
    a plurality of pinned layers that includes the pinned layer; and
    a plurality of tunnel barriers that includes the tunnel barrier, each tunnel barrier of the plurality of tunnel barriers being arranged above a respective pinned layer of the plurality of pinned layers,
    wherein, to measure the resistance at the MTJ element, the processing circuitry is adapted to measure a respective resistance between each pinned layer of the plurality of pinned layers and the free layer.

10. The device of claim 9, wherein, to determine gyroscopic motion, the processing circuitry is adapted to:
    compare two or more of the respective resistances.

11. The device of claim 9, wherein the pinned layer is a first pinned layer, wherein the plurality of pinned layer comprises a second pinned layer arranged along a first horizontal direction on an opposite side of the free layer from the first pinned layer, and wherein, to determine gyroscopic motion, the processing circuitry is adapted to:
 determine gyroscopic motion has occurred along the first horizontal direction when a first resistance between the first pinned layer and the free layer is greater than a second resistance between the second pinned layer and the free layer.

12. The device of claim 11, wherein the plurality of pinned layers comprises a third pinned layer, wherein the plurality of pinned layers comprises a fourth pinned layer arranged along a second horizontal direction on an opposite side of the free layer from the third pinned layer, wherein the second horizontal direction is perpendicular with the first horizontal direction, and wherein, to determine gyroscopic motion, the processing circuitry is adapted to:
 determine gyroscopic motion has occurred along the second horizontal direction when a third resistance between the third pinned layer and the free layer is greater than a fourth resistance between the fourth pinned layer and the free layer.

13. The device of claim 9, wherein the plurality of pinned layers is arranged relative to the free layer to detect a rectangular motion.

14. The device of claim 9, wherein the plurality of pinned layer is arranged relative to the free layer to detect a circular motion.

15. A method for detecting gyroscopic motion using a magnetic tunnel junction (MTJ) based sensor device, the method comprising:
 measuring, by processing circuitry, a resistance at a MTJ element, wherein the MTJ element comprises a free layer, a pinned layer, and a tunnel barrier, the tunnel barrier being arranged above the pinned layer and wherein the free layer is adapted to flex away from the tunnel barrier during gyroscopic motion;
 determining, by the processing circuitry, gyroscopic motion based on the resistance at the MTJ element; and
 outputting, by the processing circuitry, an indication of the gyroscopic motion.

16. The method device of claim 15, wherein the MTJ element comprises a plurality of pinned layers that includes the pinned layer, wherein the MTJ element comprises a plurality of tunnel barriers that includes the tunnel barrier, each tunnel barrier of the plurality of tunnel barriers being arranged above a respective pinned layer of the plurality of pinned layers, and wherein measuring the resistance at the MTJ element comprises:
 measuring a respective resistance between each pinned layer of the plurality of pinned layers and the free layer.

17. The method of claim 16, wherein determining gyroscopic motion comprises:
 comparing two or more of the respective resistances.

18. The method of claim 16, wherein the pinned layer is a first pinned layer, wherein the plurality of pinned layers comprises a second pinned layer arranged along a first horizontal direction on an opposite side of the free layer from the first pinned layer, and wherein determining gyroscopic motion comprises:
 determining gyroscopic motion has occurred along the first horizontal direction when a first resistance between the first pinned layer and the free layer is greater than a second resistance between the second pinned layer and the free layer.

19. The method of claim 18, wherein the plurality of pinned layers comprises a third pinned layer, wherein the plurality of pinned layers comprises a fourth pinned layer arranged along a second horizontal direction on an opposite side of the free layer from the third pinned layer, wherein the second horizontal direction is perpendicular with the first horizontal direction, and wherein determining gyroscopic motion comprises:
 determining gyroscopic motion has occurred along the second horizontal direction when a third resistance between the third pinned layer and the free layer is greater than a fourth resistance between the fourth pinned layer and the free layer.

20. A magnetic tunnel junction (MTJ) based sensor device, the device comprising:
 means for measuring a resistance at a MTJ element, wherein the MTJ element comprises a free layer, a pinned layer, and a tunnel barrier, the tunnel barrier being arranged above the pinned layer and wherein the free layer is adapted to flex away from the tunnel barrier during gyroscopic motion;
 means for determining gyroscopic motion based on the resistance at the MTJ element; and
 means for outputting an indication of the gyroscopic motion.

* * * * *